US012625588B2

(12) United States Patent
Kim et al.

(10) Patent No.: US 12,625,588 B2
(45) Date of Patent: May 12, 2026

(54) INPUT SENSOR UNIT AND DISPLAY DEVICE INCLUDING THE SAME

(71) Applicant: SAMSUNG DISPLAY CO., LTD., Yongin-si (KR)

(72) Inventors: Miyoung Kim, Yongin-si (KR); Jina Kang, Yongin-si (KR); Kyowon Ku, Yongin-si (KR); Sanghyun Lim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 89 days.

(21) Appl. No.: 18/462,786

(22) Filed: Sep. 7, 2023

(65) Prior Publication Data

US 2024/0211088 A1 Jun. 27, 2024

(30) Foreign Application Priority Data

Dec. 27, 2022 (KR) ........................ 10-2022-0185634

(51) Int. Cl.
| | |
|---|---|
| *G06F 3/046* | (2006.01) |
| *G06F 3/0354* | (2013.01) |
| *G06F 3/041* | (2006.01) |
| *G06F 3/044* | (2006.01) |
| *H10K 59/40* | (2023.01) |

(52) U.S. Cl.
CPC .......... *G06F 3/046* (2013.01); *G06F 3/03545* (2013.01); *G06F 3/04162* (2019.05); *G06F 3/0445* (2019.05); *G06F 3/0446* (2019.05); *H10K 59/40* (2023.02); *G06F 3/0412* (2013.01); *G06F 3/04164* (2019.05); *G06F 3/0448* (2019.05); *G06F 2203/04104*

(2013.01); *G06F 2203/04106* (2013.01); *G06F 2203/04111* (2013.01); *G06F 2203/04114* (2019.05)

(58) Field of Classification Search
CPC ...... G06F 3/046; G06F 3/0445; G06F 3/0446; G06F 3/0412; G06F 2203/04106; H10K 59/40
See application file for complete search history.

(56) References Cited

U.S. PATENT DOCUMENTS

| | | | |
|---|---|---|---|
| 9,158,398 | B2 | 10/2015 | Jeong et al. |
| 9,189,087 | B2 | 11/2015 | Kim |
| | | (Continued) | |

FOREIGN PATENT DOCUMENTS

| | | |
|---|---|---|
| KR | 10-1391243 | 5/2014 |
| KR | 10-1441396 | 9/2014 |
| | (Continued) | |

*Primary Examiner* — Patrick N Edouard
*Assistant Examiner* — Joseph P Fox
(74) *Attorney, Agent, or Firm* — F. CHAU & ASSOCIATES, LLC

(57) ABSTRACT

Disclosed is a display device which includes a display panel and an input sensor unit. The input sensor unit includes a base layer, a plurality of sensing electrodes, a plurality of lines, and a peripheral pen sensing electrode. The plurality of sensing electrodes include a first sensing electrode, a second sensing electrode, a pen sensing electrode 1-1, a pen sensing electrode 1-2, and a second pen sensing electrode. A first width of the peripheral pen sensing electrode in a first direction is greater than a second width of each of the plurality of lines in the first direction.

21 Claims, 19 Drawing Sheets

(56)     References Cited

U.S. PATENT DOCUMENTS

| | | | |
|---|---|---|---|
| 9,946,412 | B2 | 4/2018 | Jeon et al. |
| 11,068,092 | B2 | 7/2021 | Han et al. |
| 2015/0268795 | A1 | 9/2015 | Kurasawa et al. |
| 2021/0026493 | A1* | 1/2021 | Kim .................... G06F 3/04166 |
| 2021/0342053 | A1 | 11/2021 | Cho et al. |
| 2022/0187979 | A1* | 6/2022 | Jung ................... G06F 3/04166 |

FOREIGN PATENT DOCUMENTS

| | | |
|---|---|---|
| KR | 10-2020-0053064 | 5/2020 |
| KR | 10-2161743 | 10/2020 |

* cited by examiner

DD

PIT

HC
WP
AL1
WIN
AL2
ISL
AL3
EP
AL4
PPL
AL5
CTS1
AL6
CTS2

NDA          DA          NDA

DR3
DR2
DR1

RPL
ISP    EP
DP

NDA          DA          NDA

DR3
DR2
DR1

INPUT SENSOR UNIT AND DISPLAY DEVICE INCLUDING THE SAME

CROSS-REFERENCE TO RELATED APPLICATIONS

This application claims priority under 35 U.S.C. § 119 to Korean Patent Application No. 10-2022-0185634 filed on Dec. 27, 2022, in the Korean Intellectual Property Office, the disclosures of which are incorporated by reference herein in their entireties.

BACKGROUND

Embodiments of the present disclosure described herein relate to an input sensor unit having improved sensing reliability for an input device and a display device including the input sensor unit.

An electronic device, such as a smart phone, a digital camera, a notebook computer, a car navigation unit, a smart television, and the like, which provides an image to a user includes a display device for displaying an image. The display device generates an image and provides the image to the user through a display screen.

The display device includes a display panel that displays an image, a touch panel that is disposed on the display panel and that senses a touch of the user, and a digitizer that is disposed under the display panel and that senses a touch of a pen. The digitizer may be implemented in an electromagnetic type or an electromagnetic resonance type.

The digitizer includes a plurality of coils. When the user moves the pen on the display device, the pen is driven by an AC signal to cause an oscillating magnetic field, and the oscillating magnetic field induces a signal to the coils. The position of the pen is detected through the signal of the coils. The digitizer recognizes the position of the pen by sensing an electromagnetic change caused by access of the pen.

Two input devices, such as the touch panel and the digitizer, may be separately used, and therefore the thickness of the display device may be increased. Accordingly, the development of a technology for decreasing the thickness of the display device is desirable.

SUMMARY

Embodiments of the present disclosure provide an input sensor unit having improved sensing reliability and a display device including the same.

According to an embodiment, a display device includes a display panel, and an input sensor unit disposed on the display panel, the input sensor unit having an active region and a peripheral region, the peripheral region being adjacent to the active region. The input sensor unit includes a base layer, a plurality of sensing electrodes disposed in the active region and disposed on the base layer, a plurality of conductive lines disposed in the peripheral region and disposed on the base layer, the plurality of conductive lines being electrically connected to the plurality of sensing electrodes, and a peripheral pen sensing electrode disposed in the peripheral region and spaced apart from the plurality of sensing electrodes, wherein the plurality of conductive lines are disposed between the peripheral pen sensing electrode and the active region in which the plurality of sensing electrodes are disposed, and wherein the peripheral pen sensing electrode extends lengthwise in a first direction. The plurality of sensing electrodes include a first sensing electrode, a second sensing electrode insulated from the first sensing electrode and extending across the first sensing electrode, a pair of first pen sensing electrodes extending in a second direction different from the first direction and including a 1-1 first pen sensing electrode insulated from the second sensing electrode and extending across the second sensing electrode, the 1-1 first pen sensing electrode being adjacent to the first sensing electrode, and a 1-2 first pen sensing electrode disposed in a layer different from a layer in which the first sensing electrode and the pen sensing electrode 1-1 are disposed, the 1-2 first pen sensing electrode being electrically connected to the 1-1 first pen sensing electrode and overlapping a portion of the second sensing electrode when viewed in a plan view, and a second pen sensing electrode insulated from the first sensing electrode and the 1-1 first pen sensing electrodes and extending across the first sensing electrode and the 1-1 first pen sensing electrodes in the second direction, the second pen sensing electrode being adjacent to the second sensing electrode. A first width of the peripheral pen sensing electrode in the second direction is greater than a second width of each of the plurality of conductive lines in the second direction.

The plurality of conductive lines may include a sensing line electrically connected to the second sensing electrode and a pen sensing line electrically connected to the second pen sensing electrode.

The pen sensing line and the peripheral pen sensing electrode may be disposed in the same layer.

The pen sensing line and the peripheral pen sensing electrode may be disposed in a layer different from a layer in which the sensing line is disposed.

The input sensor unit may further include an insulating layer. The pen sensing line and the peripheral pen sensing electrode may be disposed on the base layer. The insulating layer may cover the pen sensing line and the peripheral pen sensing electrode. The sensing line may be disposed on the insulating layer.

The input sensor unit may further include an insulating layer. A first pen sensing line part of the pen sensing line and a first sensing part of the peripheral pen sensing electrode may be disposed on the base layer. The insulating layer may cover the first pen sensing line part and the first sensing part. The sensing line, a second pen sensing line part of the pen sensing line, and a second sensing part of the peripheral pen sensing electrode may be disposed on the insulating layer. The insulting layer may have a first contact hole and a second contact hole defined therein. The first pen sensing line part and the second pen sensing line part may be electrically connected with each other through the first contact hole. The first sensing part and the second sensing part may be electrically connected with each other through the second contact hole.

The first sensing part may have a greater width than the second sensing part in the second direction.

The first sensing part may overlap the second sensing part and the sensing line when viewed in a plan view.

The input sensor unit may further include an insulating layer. The pen sensing line, the peripheral pen sensing electrode, and a first line part of the sensing line may be disposed on the base layer. The insulating layer may cover the pen sensing line, the peripheral pen sensing electrode, and the first line part. A second line part of the sensing line may be disposed on the insulating layer. The insulating layer may have a contact hole defined therein. The first line part and the second line part may be electrically connected with each other through the contact hole.

The sensing line may overlap the pen sensing line when viewed in a plan view.

The sensing line may overlap the peripheral pen sensing electrode when viewed in a plan view.

The peripheral pen sensing electrode may be electrically connected to the pair of first pen sensing electrodes.

The peripheral pen sensing electrode may have a larger area than the plurality of lines when viewed from in a plan view.

According to an embodiment, an input sensor unit includes a base layer having an active region and a peripheral region, the peripheral region being adjacent to the active region, an insulating layer disposed on the base layer, a plurality of sensing electrodes disposed in the active region and disposed on the base layer, a plurality of conductive lines disposed in the peripheral region and disposed on the base layer, the plurality of conductive lines being electrically connected to the plurality of sensing electrodes, and a peripheral pen sensing electrode disposed in the peripheral region and spaced apart from the plurality of sensing electrodes, wherein the plurality of conductive lines are disposed between the peripheral pen sensing electrode and the active region in which the plurality of sensing electrodes are disposed, and wherein the peripheral pen sensing electrode extends lengthwise in a first direction. The plurality of sensing electrodes include a first sensing electrode, a second sensing electrode insulated from the first sensing electrode and extending across the first sensing electrode, a pair of first pen sensing electrodes extending in a second direction different from the first direction and including a 1-1 first pen sensing electrode insulated from the second sensing electrode and extending across the second sensing electrode, the 1-1 first pen sensing electrode being adjacent to the first sensing electrode, and a 1-2 first pen sensing electrode 1-2 disposed in a layer different from a layer in which the first sensing electrode and the 1-1 first pen sensing electrode are disposed, the 1-2 first pen sensing electrode being electrically connected to the 1-1 first pen sensing electrode and overlapping a portion of the second sensing electrode when viewed in a plan view, and a second pen sensing electrode insulated from the first sensing electrode and the 1-1 first pen sensing electrodes and extending across the first sensing electrode and the 1-1 first pen sensing electrodes in the second direction, the second pen sensing electrode being adjacent to the second sensing electrode. The plurality of conductive lines include a sensing line electrically connected to the second sensing electrode, and a pen sensing line electrically connected to the second pen sensing electrode. A first width of the peripheral pen sensing electrode in the second direction is greater than a second width of the sensing line in the second direction.

The pen sensing line and the peripheral pen sensing electrode may be disposed in the same layer.

The pen sensing line and the peripheral pen sensing electrode may be disposed in a layer different from a layer in which the sensing line is disposed.

The pen sensing line and the peripheral pen sensing electrode may be disposed on the base layer. The insulating layer may cover the pen sensing line and the peripheral pen sensing electrode. The sensing line may be disposed on the insulating layer.

A first pen sensing line part of the pen sensing line and a first sensing part of the peripheral pen sensing electrode may be disposed on the base layer. The insulating layer may cover the first pen sensing line part and the first sensing part. The sensing line, a second pen sensing line part of the pen sensing line, and a second sensing part of the peripheral pen sensing electrode may be disposed on the insulating layer. The insulting layer may have a first contact hole and a second contact hole defined therein. The first pen sensing line part and the second pen sensing line part may be electrically connected with each other through the first contact hole. The first sensing part and the second sensing part may be electrically connected with each other through the second contact hole.

The first sensing part may have a greater width than the second sensing part in the second direction.

The pen sensing line, the peripheral pen sensing electrode, and a first line part of the sensing line may be disposed on the base layer. The insulating layer may cover the pen sensing line, the peripheral pen sensing electrode, and the first line part. A second line part of the sensing line may be disposed on the insulating layer. The insulating layer may have a contact hole defined therein. The first line part and the second line part may be electrically connected through the contact hole.

According to an embodiment, a display device includes a display panel, and an input sensor unit disposed on the display panel, the input sensor unit having an active region and a peripheral region, the peripheral region being adjacent to the active region. The input sensor unit includes a base layer, a plurality of sensing electrodes disposed in the active region and disposed on the base layer, a plurality of conductive lines disposed in the peripheral region and disposed on the base layer, the plurality of conductive lines being electrically connected to the plurality of sensing electrodes; and a peripheral pen sensing electrode disposed in the peripheral region and extending lengthwise in a first direction, wherein the plurality of conductive lines are disposed between the peripheral pen sensing electrode and the active region. A first width of the peripheral pen sensing electrode in a second direction different from the first direction is greater than a second width of each of the plurality of conductive lines in the second direction.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
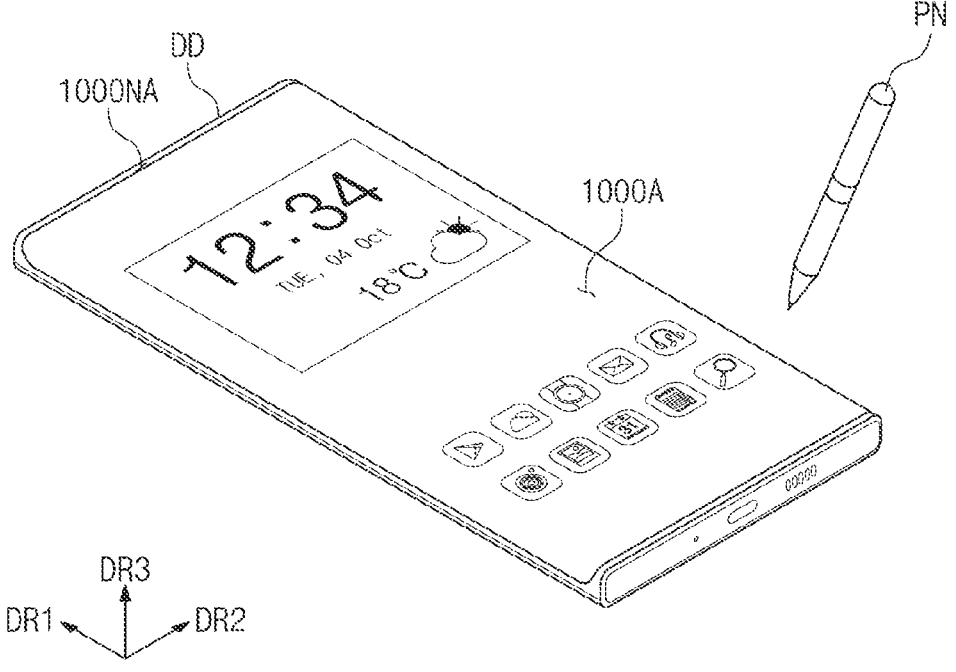
FIG. 1 is a perspective view of a display device according to an embodiment of the present disclosure.

In this specification, when it is mentioned that a component (or, a region, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, embodiments of the present disclosure will be described with reference to the accompanying drawings.

FIG. 1 is a perspective view of a display device according to an embodiment of the present disclosure.

Referring to FIG. 1, the display device DD may sense a first input by an input device PN. The display device DD may be a device activated in response to an electrical signal. For example, the display device DD may be a mobile phone, a tablet computer, a car navigation unit, a game machine, or a wearable device, but is not limited thereto. FIG. 1 illustrates an example that the display device DD is a mobile phone.

An active region 1000A and a peripheral region 1000NA may be defined in the display device DD. The display device DD may display an image through the active region 1000A. The active region 1000A may include a plane defined by a first direction DR1 and a second direction DR2. The peripheral region 1000NA may surround the active region 1000A.

The display device DD may sense inputs applied from outside the display device DD. The external inputs may include various types of external inputs, such as a part of a user's body, light, heat, and pressure. The external inputs may be referred to as a second input.

The display device DD illustrated in FIG. 1 may sense an input by a touch of the user and an input by the input device PN. The input device PN may mean a device other than the user's body. The input by the input device PN may be referred to as the first input. For example, the input device PN may be an active electrostatic (AES) pen, an electromagnetic resonance (EMR) pen, a stylus pen, a touch pen, or an electronic pen. Hereinafter, it will be exemplified that the input device PN is an electromagnetic resonance (EMR) pen.

Figure 2:
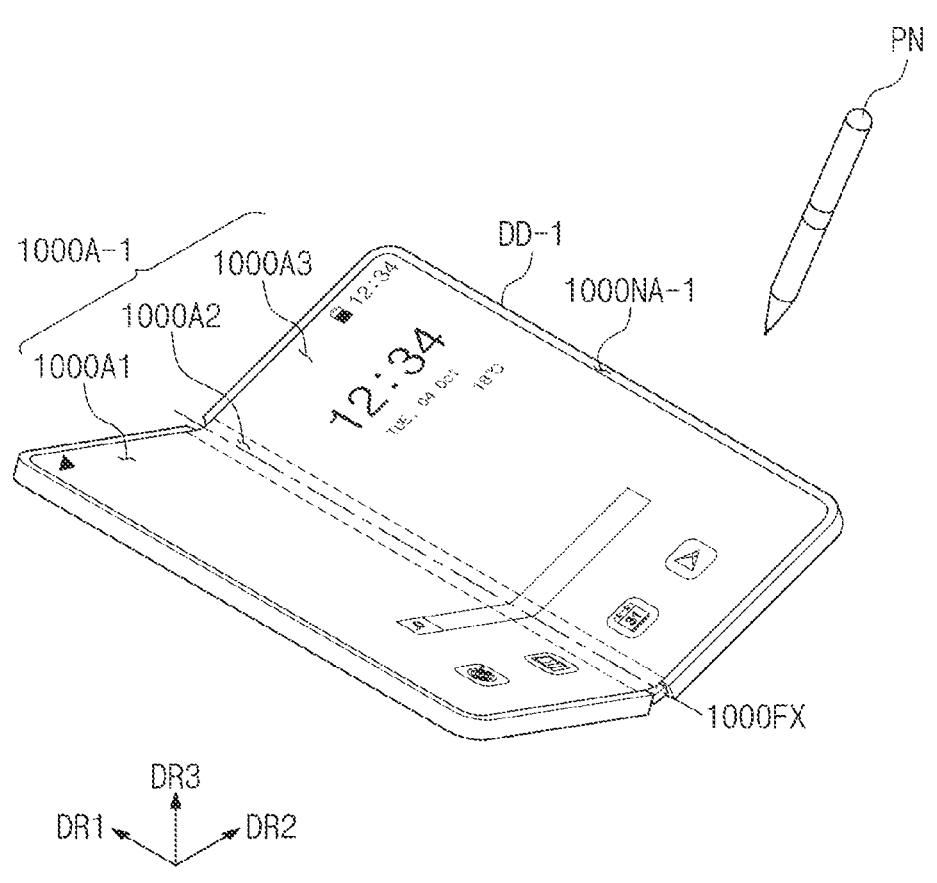
FIG. 2 is a perspective view illustrating a display device according to an embodiment of the present disclosure.

FIG. 2 is a perspective view illustrating a display device according to an embodiment of the present disclosure. In describing FIG. 2, components identical to the components described with reference to FIG. 1 will be assigned with identical reference numerals, and descriptions thereabout will be omitted.

FIG. 2 illustrates a state in which the display device DD-1 is folded with a certain angle. Referring to FIG. 2, in an unfolded state of the display device DD-1, an active region 1000A-1 may include a plane defined by the first direction DR1 and the second direction DR2.

The active region 1000A-1 may include a first region 1000A1, a second region 1000A2, and a third region 1000A3. The first region 1000A1, the second region 1000A2, and the third region 1000A3 may be sequentially defined in the second direction DR2. The second region 1000A2 may be curved about a folding axis FX extending in the first direction DR1. Accordingly, the first region 1000A1 and the third region 1000A3 may be referred to as non-folding regions, and the second region 1000A2 may be referred to as a folding region.

When the display device DD-1 is folded, the first region 1000A1 and the third region 1000A3 may face each other. Accordingly, in a fully folded state, the active region 1000A-1 may not be exposed to the outside, and this operation may be referred to as an in-folding operation. However, this is illustrative, and an operation of the display device DD-1 according to an embodiment of the present disclosure is not limited thereto.

For example, when the display device DD-1 according to an embodiment of the present disclosure is folded, the first region 1000A1 and the third region 1000A3 may face away from each other. Accordingly, in the folded state, the active region 1000A-1 may be exposed to the outside, and this operation may be referred to as an out-folding operation.

The display device DD-1 may perform only one of the in-folding operation and the out-folding operation. Alternatively, the display device DD-1 may perform both the in-folding operation and the out-folding operation. In this case, the same region of the display device DD-1, for example, the second region 1000A2 may be folded inward and outward.

Although one folding region and two non-folding regions are illustrated as an example in the FIG. 2, the numbers of folding regions and non-folding regions are not limited thereto. For example, the display device DD-1 may include more than two non-folding regions and a plurality of folding regions, each of which is disposed between non-folding regions adjacent to each other.

Although FIG. 2 illustrates an example that the folding axis 1000FX extends in the first direction DR1, the present disclosure is not limited thereto. For example, the folding axis 1000FX may extend parallel to the second direction DR2. In this case, the first region 1000A1, the second region 1000A2, and the third region 1000A3 may be sequentially arranged in the first direction DR1.

Figure 3:
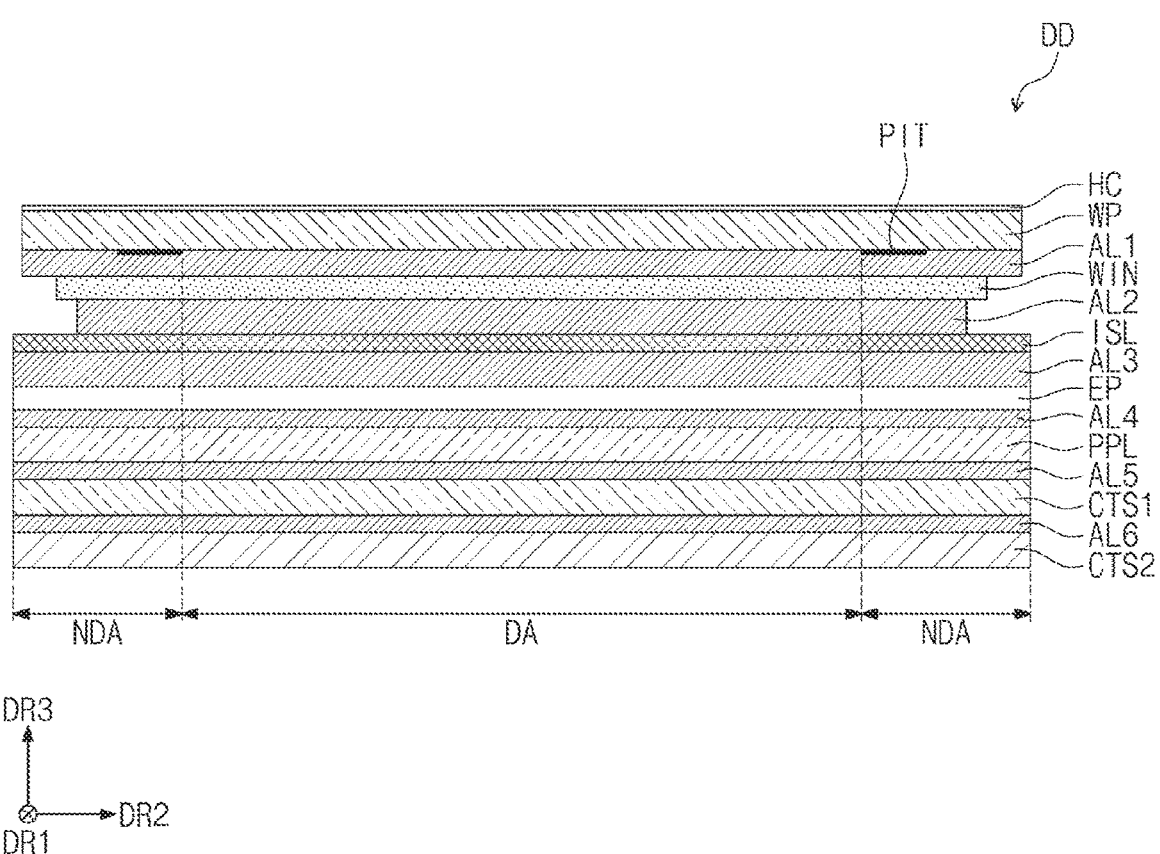
FIG. 3 is a sectional view of a display device according to an embodiment of the present disclosure.

FIG. 3 is a sectional view of a display device according to an embodiment of the present disclosure.

Referring to FIG. 3, the display device DD may include an electronic panel EP, an impact absorbing layer ISL, a panel protection layer PPL, a first conductive sheet CTS1, a second conductive sheet CTS2, a window WIN, a window protection layer WP, a hard coating layer HC, and first to sixth adhesive layers AL1 to AL6.

The electronic panel EP may display an image, may sense the first and second inputs described above, and may decrease the reflectance of external light. The electronic panel EP may include a display panel, an input sensor unit, and an anti-reflection layer, and the configuration of the electronic panel EP will be described below with reference to FIG. 4.

The impact absorbing layer ISL may be disposed on the electronic panel EP. The impact absorbing layer ISL may protect the electronic panel EP by absorbing an external impact applied from above the display device DD toward the electronic panel EP. The impact absorbing layer ISL may be manufactured in the form of a stretchable film.

The impact absorbing layer ISL may include or may be formed of a flexible plastic material. The flexible plastic material may include a synthetic resin film. For example, the impact absorbing layer ISL may include or may be formed of a flexible plastic material such as polyimide (PI) and polyethylene terephthalate (PET).

The panel protection layer PPL may be disposed under the electronic panel EP. The panel protection layer PPL may protect a lower part of the electronic panel EP. The panel protection layer PPL may include or may be formed of a flexible plastic material. For example, the panel protection layer PPL may include or may be formed of polyethylene terephthalate (PET).

The first conductive sheet CTS1 may be disposed under the panel protection layer PPL. The second conductive sheet CTS2 may be disposed under the first conductive sheet CTS1. The first conductive sheet CTS1 and the second conductive sheet CTS2 may include or may be formed of metal.

The first conductive sheet CTS1 may include or may be formed of a ferromagnetic material. For example, the first conductive sheet CTS1 may be a ferrite sheet including ferrite. The second conductive sheet CTS2 may include or may be formed of a diamagnetic material. For example, the second conductive sheet CTS2 may be a copper sheet including copper. The first and second conductive sheets CTS1 and CTS2 may shield an external magnetic field such that the external magnetic field is not applied to the electronic panel EP from below the display device DD.

The window WIN may be disposed on the impact absorbing layer ISL. The window WIN may protect the electronic panel EP from external scratches. The window WIN may be optically clear. The window WIN may include or may be formed of glass. However, without being limited thereto, the window WIN may include or may be formed of a synthetic resin film.

The window WIN may have a multi-layer structure or a single-layer structure. For example, the window WIN may include a plurality of synthetic resin films coupled by an adhesive, or may include a glass substrate and a synthetic resin film coupled by an adhesive.

The window protection layer WP may be disposed on the window WIN. The window protection layer WP may include or may be formed of a flexible plastic material such as polyimide and polyethylene terephthalate. The hard coating layer HC may be disposed on an upper surface of the window protection layer WP.

A printed layer PIT may be disposed on a lower surface of the window protection layer WP. The printed layer PIT may be black in color. However, the color of the printed layer PIT is not limited thereto. The printed layer PIT may be adjacent to the periphery of the window protection layer WP. The printed layer PIT may overlap a non-display region NDA.

The first adhesive layer AL1 may be disposed between the window protection layer WP and the window WIN. The window protection layer WP and the window WIN may be bonded with each other by the first adhesive layer AL1. The first adhesive layer AL1 may cover the printed layer PIT.

The second adhesive layer AL2 may be disposed between the window WIN and the impact absorbing layer ISL. The window WIN and the impact absorbing layer ISL may be bonded with each other by the second adhesive layer AL2.

The third adhesive layer AL3 may be disposed between the impact absorbing layer ISL and the electronic panel EP. The impact absorbing layer ISL and the electronic panel EP may be bonded with each other by the third adhesive layer AL3.

The fourth adhesive layer AL4 may be disposed between the electronic panel EP and the panel protection layer PPL. The electronic panel EP and the panel protection layer PPL may be bonded with each other by the fourth adhesive layer AL4.

The fifth adhesive layer AL5 may be disposed between the panel protection layer PPL and the first conductive sheet CTS1. The panel protection layer PPL and the first conductive sheet CTS1 may be bonded with each other by the fifth adhesive layer AL5.

The sixth adhesive layer AL6 may be disposed between the first conductive sheet CTS1 and the second conductive sheet CTS2. The first conductive sheet CTS1 and the second conductive sheet CTS2 may be bonded with each other by the sixth adhesive layer AL6.

The first to sixth adhesive layers AL1 to AL6 may include or may be formed of a pressure sensitive adhesive (PSA) or an optically clear adhesive (OCA). However, the type of adhesive is not limited thereto.

Figure 4:
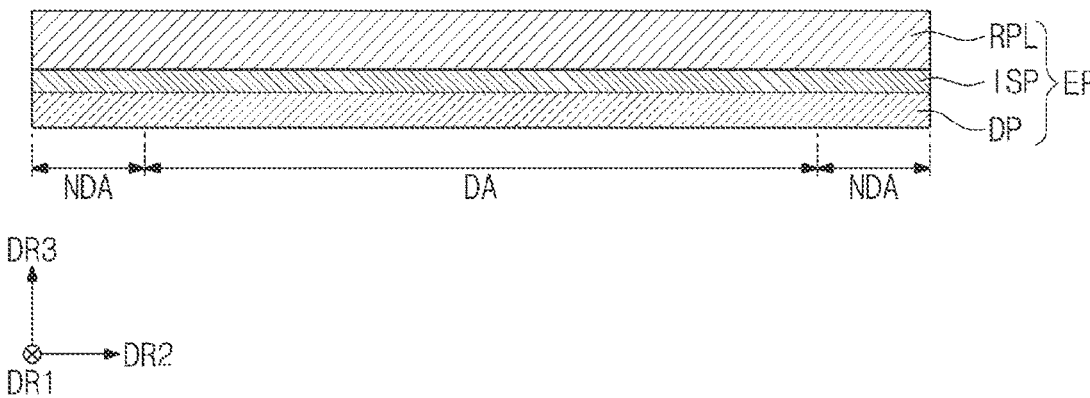
FIG. 4 is a sectional view illustrating an electronic panel according to an embodiment of the present disclosure.

FIG. 4 is a sectional view illustrating the electronic panel according to an embodiment of the present disclosure.

Referring to FIG. 4, the electronic panel EP may include the display panel DP, the input sensor unit ISP disposed on the display panel DP, and the anti-reflection layer RPL disposed on the input sensor unit ISP. The display panel DP may be a flexible display panel. For example, the display panel DP may include a flexible substrate and a plurality of elements disposed on the flexible substrate.

The display panel DP according to an embodiment of the present disclosure may be an emissive display panel, but is not particularly limited thereto. For example, the display panel DP may be an organic light emitting display panel, a quantum-dot display panel, a micro-LED display panel, or a nano-LED display panel. An emissive layer of the organic light emitting display panel may include an organic light emitting material. An emissive layer of the quantum-dot display panel may include quantum dots and quantum rods. An emissive layer of the micro-LED display panel may include micro LEDs. An emissive layer of the nano-LED display panel may include nano LEDs. Hereinafter, it will be exemplified that the display panel DP is an organic light emitting display panel.

The input sensor unit ISP may include a plurality of pen sensing electrodes (hereinafter, illustrated in FIG. 8) for sensing the above-described first input using an electromagnetic method or an electromagnetic resonance method. The input sensor unit ISP may include a plurality of sensing electrodes (hereinafter, illustrated in FIG. 8) for sensing the above-described second input using a capacitive method. The input sensor unit ISP may be directly formed on the display panel DP when the electronic panel EP is manufactured.

The anti-reflection layer RPL may be disposed on the input sensor unit ISP. The anti-reflection layer RPL may be directly formed on the input sensor unit ISP when the electronic panel EP is manufactured. The anti-reflection layer RPL may be defined as a film for preventing reflection of external light. The anti-reflection layer RPL may decrease the reflectance of external light incident toward the display panel DP from above the display device DD.

For example, the input sensor unit ISP may be directly formed on the display panel DP, and the anti-reflection layer RPL may be directly formed on the input sensor unit ISP. However, embodiments of the present disclosure are not limited thereto. For example, the input sensor unit ISP may be separately manufactured and may be attached to the display panel DP by an adhesive layer, and the anti-reflection layer RPL may be separately manufactured and may be attached to the input sensor unit ISP by an adhesive layer.

Figure 5:
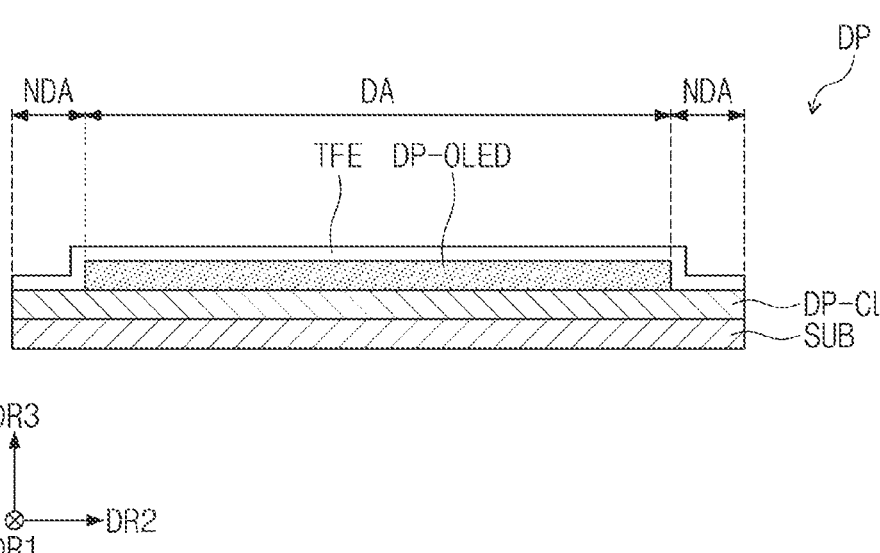
FIG. 5 is a sectional view illustrating a display panel according to an embodiment of the present disclosure.

FIG. 5 is a sectional view illustrating the display panel according to an embodiment of the present disclosure.

Referring to FIG. 5, the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include a display region DA and a non-display region NDA around the display region DA. The substrate SUB may include or may be formed of a flexible plastic material such as polyimide (PI).

The substrate SUB may be a member that provides a base surface on which the circuit element layer DP-CL is disposed. The substrate SUB may be a glass substrate, a metal substrate, or a polymer substrate. However, embodiments of the present disclosure are not limited thereto, and the substrate SUB may be an inorganic layer, an organic layer, or a composite layer.

The substrate SUB may have a multi-layer structure. For example, the substrate SUB may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include or may be formed of a polyimide-based resin. Alternatively, each of the first and second synthetic resin layers may include or may be formed of at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. Meanwhile, a "X"-based resin used herein may mean a resin including a "X" functional group.

The circuit element layer DP-CL may be disposed on the substrate SUB. The circuit element layer DP-CL may include an insulating layer, a semiconductor pattern, a conductive pattern, and a signal line. An insulating layer, a semiconductor layer, and a conductive layer may be formed on the substrate SUB through a process such as coating and deposition and may be selectively subjected to patterning by performing a photolithography process a plurality of times. Thereafter, the semiconductor pattern, the conductive pattern, and the signal line included in the circuit element layer DP-CL may be formed.

The display element layer DP-OLED may be disposed on the circuit element layer DP-CL. The display element layer DP-OLED may be disposed on the display region DA. A plurality of pixels PX (refer to FIG. 6) may be disposed in the display region DA. Each of the pixels may include a light emitting element that is connected to a transistor disposed in the circuit element layer DP-CL and is disposed in the display element layer DP-OLED.

The thin film encapsulation layer TFE may be disposed on the circuit element layer DP-CL to cover the display element layer DP-OLED. The thin film encapsulation layer TFE may include inorganic layers and an organic layer between the inorganic layers. The inorganic layers may protect the pixels from moisture/oxygen. The organic layer may protect the pixels from foreign matter such as dust particles.

Figure 6:
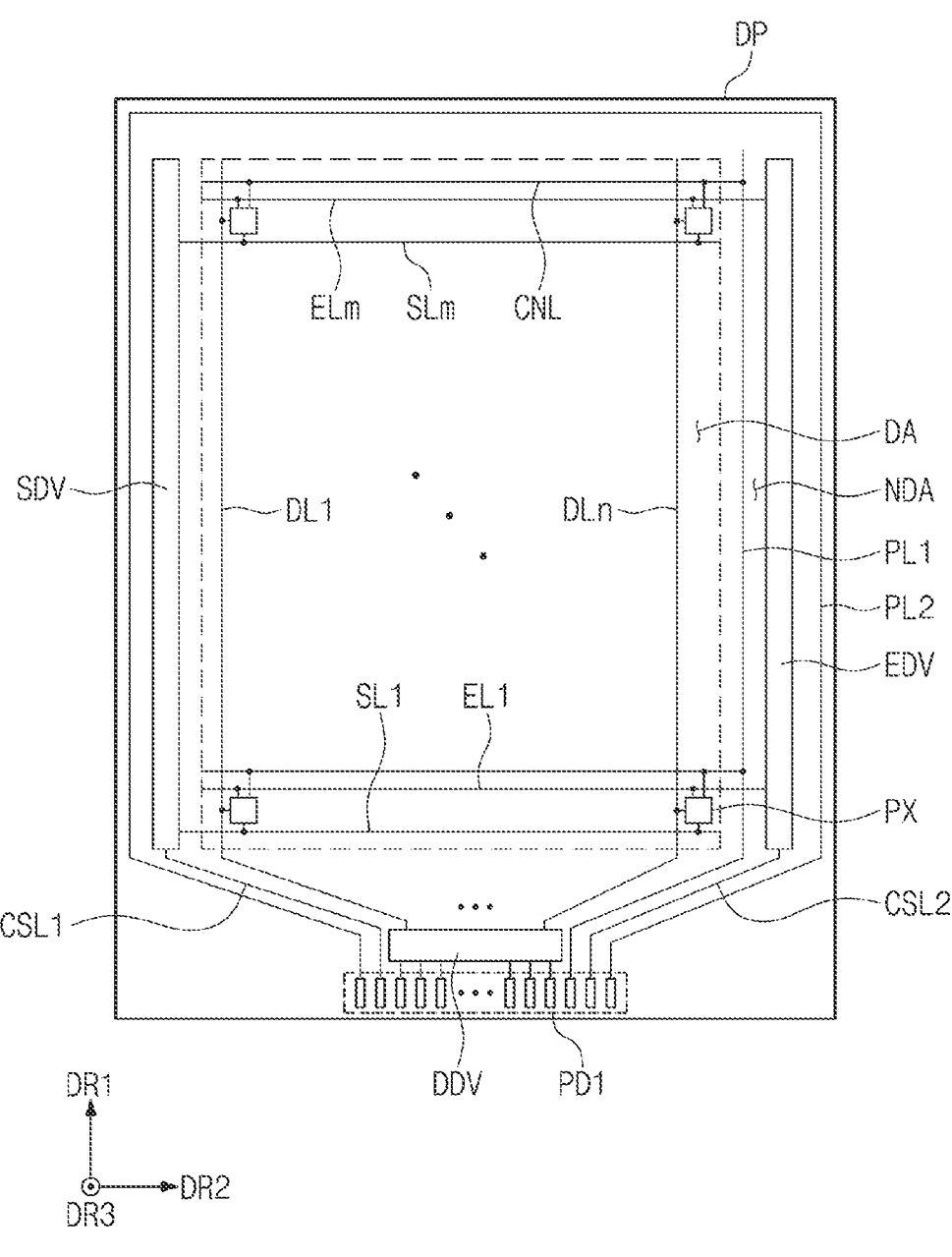
FIG. 6 is a plan view illustrating a part of the electronic panel according to an embodiment of the present disclosure.

FIG. 6 is a plan view illustrating a part of the electronic panel according to an embodiment of the present disclosure.

Referring to FIG. 6, the electronic panel EP (refer to FIG. 4) may include the display panel DP, a scan driver SDV, a data driver DDV, a light emission driver EDV, and a plurality of first pads PD1.

The display panel DP may have a rectangular shape with long sides extending in the first direction DR1 and short sides extending in the second direction DR2. However, the shape of the display panel DP is not limited thereto. The display panel DP may include a display region DA and a non-display region NDA surrounding the display region DA.

The display panel DP may include the plurality of pixels PX, a plurality of scan lines SL1 to SLm, a plurality of data lines DL1 to DLn, a plurality of light emission lines EL1 to ELm, first and second control lines CSL1 and CSL2, first and second power lines PL1 and PL2, and connecting lines CNL. "m" and "n" are natural numbers.

The pixels PX may be disposed in the display region DA. The scan driver SDV and the light emission driver EDV may be disposed in the non-display regions NDA adjacent to the long sides of the display panel DP, respectively. The data driver DDV may be disposed in the non-display region NDA adjacent to one of the short sides of the display panel DP. The data driver DDV may be adjacent to a lower end of the display panel DP when viewed from above the plane (i.e., when viewed in a plan view).

The scan lines SL1 to SLm may extend in the second direction DR2 and may be connected to the pixels PX and the scan driver SDV. The data lines DL1 to DLn may extend in the first direction DR1 and may be connected to the pixels PX and the data driver DDV. The light emission lines EL1 to ELm may extend in the second direction DR2 and may be connected to the pixels PX and the light emission driver EDV.

The first power line PL1 may extend in the first direction DR1 and may be disposed in the non-display region NDA. The first power line PL1 may be disposed between the display region DA and the light emission driver EDV.

The connecting lines CNL may extend in the second direction DR2 and may be arranged in the first direction DR1 and connected to the first power line PL1 and the pixels PX. A first voltage may be applied to the pixels PX through the first power line PL1 and the connecting lines CNL connected with each other.

The second power line PL2 may be disposed in the non-display region NDA and may extend along the long sides of the display panel DP and the other short side of the display panel DP where the data driver DDV is not disposed. The second power line PL2 may be disposed between an outer boundary of the display panel DP and each of the scan driver SDV and the light emission driver EDV.

Although not illustrated, the second power line PL2 may extend toward the display region DA and may be connected to the pixels PX. A second voltage having a lower level than the first voltage may be applied to the pixels PX through the second power line PL2.

The first control line CSL1 may be connected to the scan driver SDV and may extend toward the lower end of the display panel DP. The second control line CSL2 may be connected to the light emission driver EDV and may extend toward the lower end of the display panel DP. The data driver DDV may be disposed between the first control line CSL1 and the second control line CSL2.

The first pads PD1 may be disposed in the non-display region NDA adjacent to the lower end of the display panel DP and may be closer to the lower end of the display panel DP than the data driver DDV. The data driver DDV, the first power line PL1, the second power line PL2, the first control line CSL1, and the second control line CSL2 may be connected to the first pads PD1. The data lines DL1 to DLn may be connected to the data driver DDV, and the data driver DDV may be connected to the first pads PD1 corresponding to the data lines DL1 to DLn.

Although not illustrated, the display device DD may further include a timing controller for controlling operations of the scan driver SDV, the data driver DDV, and the light emission driver EDV and a voltage generator for generating the first and second voltages. The timing controller and the voltage generator may be connected to the first pads PD1 through a printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The light emission driver EDV may generate a plurality of light emission signals, and the light emission signals may be applied to the pixels PX through the light emission lines EL1 to ELm.

The pixels PX may receive the data voltages in response to the scan signals. The pixels PX may display an image by emitting light having luminance corresponding to the data voltages in response to the light emission signals.

Figure 7:
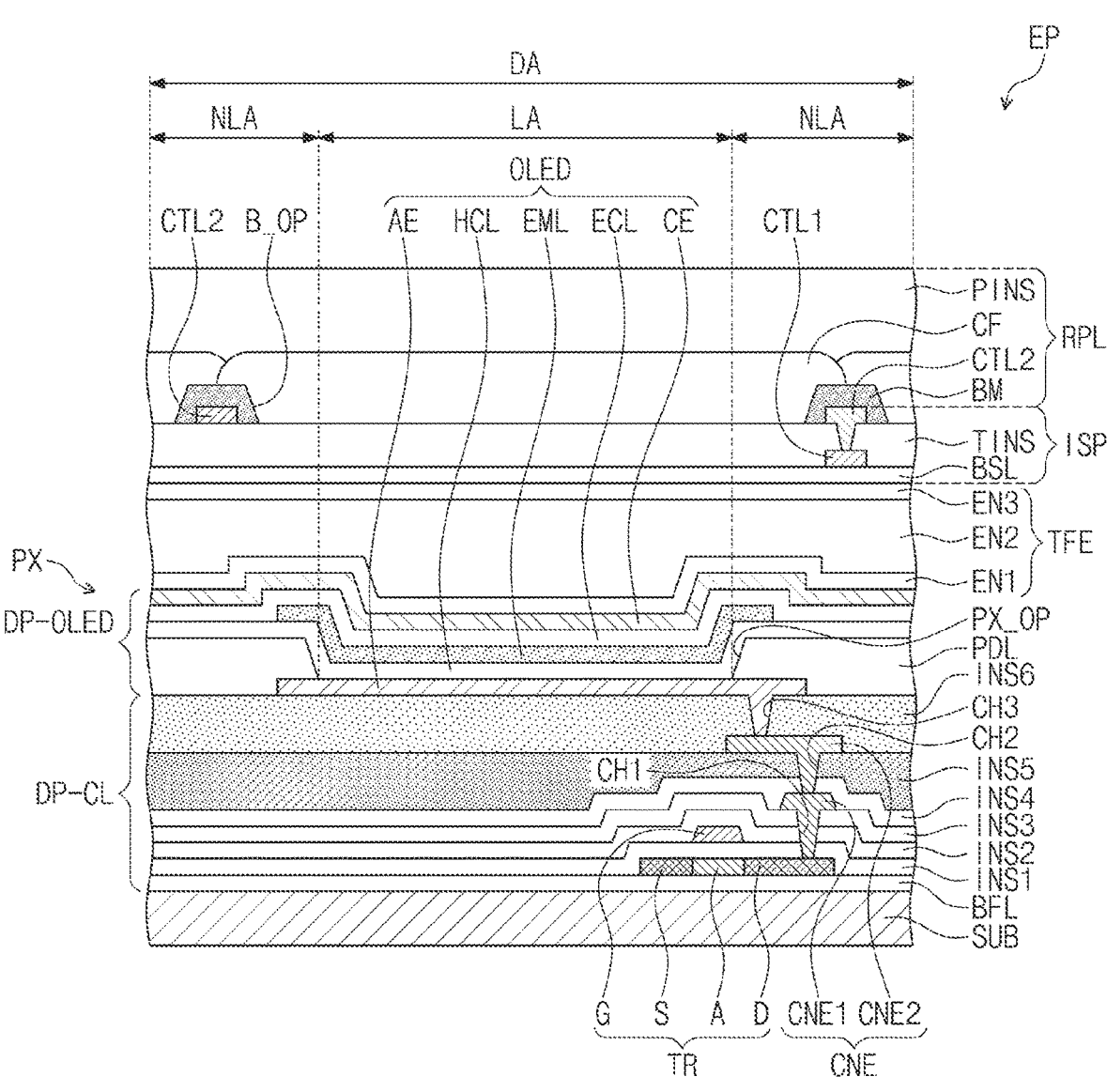
FIG. 7 is a sectional view illustrating the electronic panel according to an embodiment of the present disclosure.

FIG. 7 is a sectional view illustrating the electronic panel according to an embodiment of the present disclosure.

Referring to FIG. 7, a pixel PX may include a transistor TR and a light emitting element OLED. The light emitting element OLED may include a first electrode AE (or, an anode), a second electrode CE (or, a cathode), a hole control layer HCL, an electron control layer ECL, and an emissive layer EML.

The transistor TR and the light emitting element OLED may be disposed on the substrate SUB. Although one transistor TR is illustrated as an example, the pixel PX may substantially include a plurality of transistors and at least one capacitor for driving the light emitting element OLED.

The display region DA may include an emissive region LA corresponding to each of the pixels PX and a non-emissive region NLA around the emissive region LA. The light emitting element OLED may be disposed in the emissive region LA.

A buffer layer BFL may be disposed on the substrate SUB. The buffer layer BFL may be an inorganic layer. A semiconductor pattern may be disposed on the buffer layer BFL. The semiconductor pattern may include or may be formed of poly silicon, amorphous silicon, or metal oxide.

The semiconductor pattern may be doped with an N-type dopant or a P-type dopant. The semiconductor pattern may include a heavily doped region and a lightly doped region. The heavily doped region may have a higher conductivity than the lightly doped region and may substantially serve as a source electrode and a drain electrode of the transistor TR. The lightly doped region may substantially correspond to an active (or, channel) region of the transistor.

A source S, an active region A, and a drain D of the transistor TR may be formed from the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

To connect the transistor TR and the light emitting element OLED with each other, a connecting electrode CNE may include a first connecting electrode CNE1 and a second connecting electrode CNE2. The first connecting electrode CNE1 may be disposed on the third insulating layer INS3 and may be connected to the drain D through a first contact hole CH1 defined in the first to third insulating layers INS1 to INS3.

A fourth insulating layer INS4 may be disposed on the first connecting electrode CNE1. A fifth insulating layer INS5 may be disposed on the fourth insulating layer INS4. The second connecting electrode CNE2 may be disposed on the fifth insulating layer INS5. The second connecting electrode CNE2 may be connected to the first connecting electrode CNE1 through a second contact hole CH2 defined in the fourth and fifth insulating layers INS4 and INS5.

A sixth insulating layer INS6 may be disposed on the second connecting electrode CNE2. The layers from the buffer layer BFL to the sixth insulating layer INS6 may be defined as the circuit element layer DP-CL. The first to sixth insulating layers INS1 to INS6 may be inorganic layers or organic layers.

The first electrode AE may be disposed on the sixth insulating layer INS6. The first electrode AE may be connected to the second connecting electrode CNE2 through a third contact hole CH3 defined in the sixth insulating layer INS6. A pixel defining layer PDL having an opening PX_OP defined therein for exposing a predetermined portion of the first electrode AE may be disposed on the first electrode AE and the sixth insulating layer INS6.

The hole control layer HCL may be disposed on the first electrode AE and the pixel defining layer PDL. The hole control layer HCL may include a hole transport layer and a hole injection layer.

The emissive layer EML may be disposed on the hole control layer HCL. The emissive layer EML may be disposed in a region corresponding to the opening PX_OP. The emissive layer EML may include or may be formed of an organic material and/or an inorganic material. The emissive layer EML may generate one of red light, green light, and blue light.

The electron control layer ECL may be disposed on the emissive layer EML and the hole control layer HCL. The electron control layer ECL may include an electron transport layer and an electron injection layer. The hole control layer HCL and the electron control layer ECL may be commonly disposed in the emissive region LA and the non-emissive region NLA.

The second electrode CE may be disposed on the electron control layer ECL. The second electrode CE may be commonly disposed for the pixels PX. The layer having the light emitting element OLED disposed therein may be defined as the display element layer DP-OLED.

The thin film encapsulation layer TFE may be disposed on the second electrode CE and may cover the pixel PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 may include inorganic insulating layers and may protect the pixel PX from moisture/oxygen. The second encapsulation layer EN2 may include an organic insulating layer and may protect the pixel PX from foreign matter such as dust particles.

The first voltage may be applied to the first electrode AE through the transistor TR, and the second voltage having a lower level than the first voltage may be applied to the second electrode CE. Holes and electrons injected into the emissive layer EML may be combined to form excitons, and as the excitons transition to a ground state, the light emitting element OLED may emit light.

The input sensor unit ISP may be disposed on the thin film encapsulation layer TFE. The input sensor unit ISP may be directly manufactured on an upper surface of the thin film encapsulation layer TFE.

A base layer BSL may be disposed on the thin film encapsulation layer TFE. The base layer BSL may include an inorganic insulating layer. At least one inorganic insulating layer may be provided on the thin film encapsulation layer TFE as the base layer BSL.

The input sensor unit ISP may include a first conductive pattern CTL1 and a second conductive pattern CTL2 disposed over the first conductive pattern CTL1. The first conductive pattern CTL1 may be disposed on the base layer BSL. An insulating layer TINS may be disposed on the base layer BSL to cover the first conductive pattern CTL1. The insulating layer TINS may include an inorganic insulating layer or an organic insulating layer. The second conductive pattern CTL2 may be disposed on the insulating layer TINS.

The first and second conductive patterns CTL1 and CTL2 may overlap the non-emissive region NLA. Although not illustrated, the first and second conductive patterns CTL1 and CTL2 may be disposed on the non-emissive region NLA between the emissive regions LA and may have a mesh shape.

The first and second conductive patterns CTL1 and CTL2 may form the sensing electrodes and the pen sensing electrodes of the input sensor unit ISP described above. For example, the first and second conductive patterns CTL1 and CTL2 having a mesh shape may be separated from each other in a predetermined region to form the sensing electrodes and the pen sensing electrodes. A portion of the second conductive pattern CTL2 may be connected to the first conductive pattern CTL1.

The anti-reflection layer RPL may be disposed on the second conductive pattern CTL2. The anti-reflection layer RPL may include a black matrix BM and a plurality of color filters CF. The black matrix BM may overlap the non-emissive region NLA, and the color filters CF may overlap the emissive regions LA, respectively.

The black matrix BM may be disposed on the insulating layer TINS to cover the second conductive pattern CTL2. An opening B_OP may be defined in the black matrix BM, and a region wherein the opening B_OP is formed in the black matrix BM may overlap the emissive region LA. The opening PX_OP may be defined in the pixel defining layer PDL. The opening PX_OP may be disposed under the opening B_OP. The black matrix BM may absorb and block light. The width of the opening B_OP may be greater than the width of the opening PX_OP.

The color filters CF may be disposed on the insulating layer TINS and the black matrix BM. The color filters CF may be disposed in the openings B_OP, respectively. A planarization insulating layer PINS may be disposed on the color filters CF. The planarization insulating layer PINS may provide a flat upper surface. The planarization insulating layer PINS may include an organic insulating layer.

When external light travelling toward the display panel DP is reflected from the display panel DP and provided back to the user, the user may visually recognize the external light as in a mirror. To prevent such a phenomenon, for example, the anti-reflection layer RPL may include the plurality of color filters CF that display the same colors as those of the pixels PX of the display panel DP. The color filters CF may filter the external light with the same colors as the pixels PX. In this case, the external light may not be visible to the user.

Figure 8A:
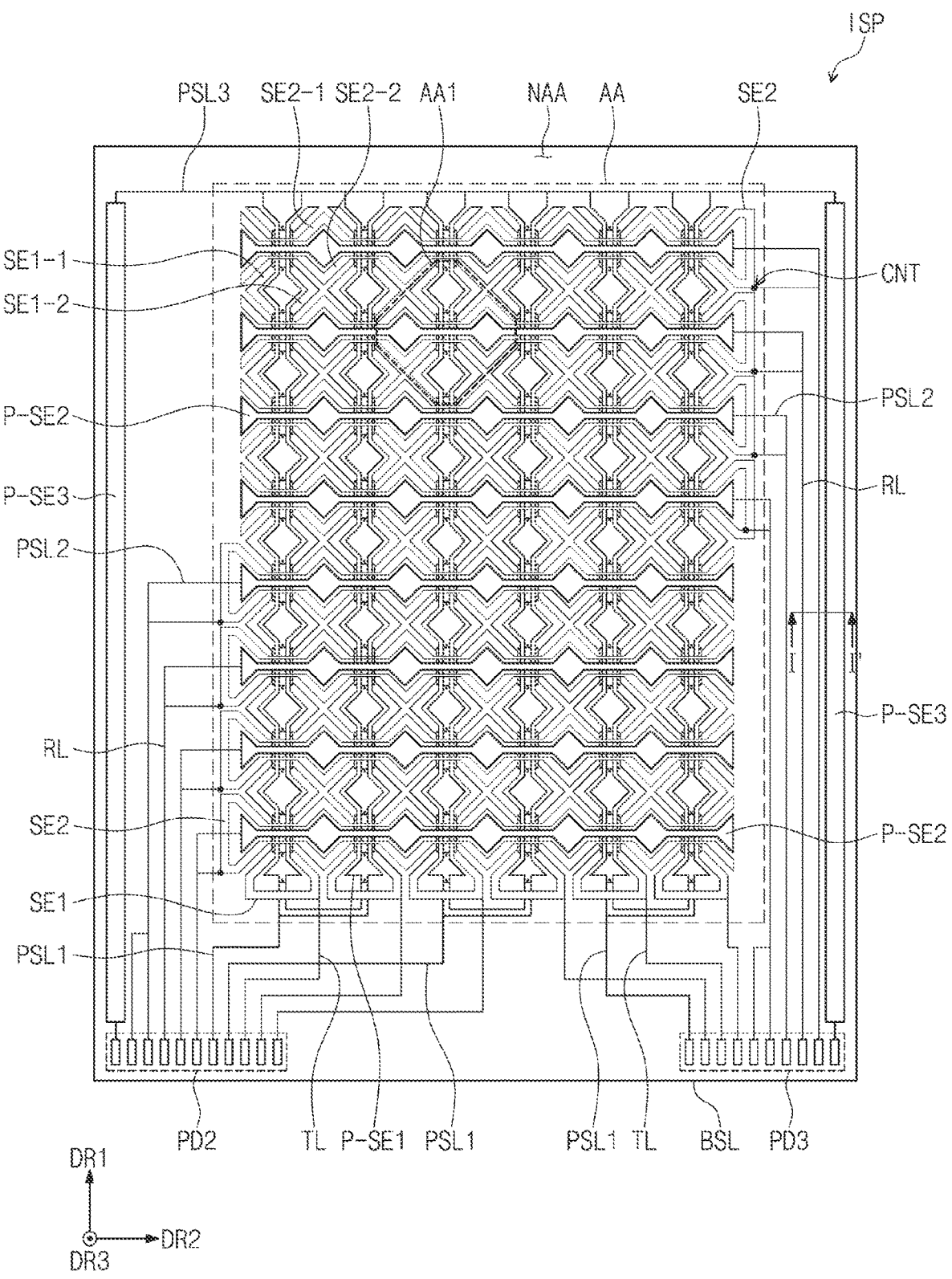
FIG. 8A is a plan view illustrating an input sensor unit according to an embodiment of the present disclosure.

FIG. 8A is a plan view illustrating the input sensor unit according to an embodiment of the present disclosure.

Referring to FIG. 8A, the input sensor unit ISP may include the base layer BSL, a plurality of sensing electrodes SE1 and SE2, a plurality of sensing lines TL and RL, a plurality of pen sensing electrodes P-SE1 and P-SE2, a plurality of pen sensing lines PSL1, PSL2, and PSL3, a peripheral pen sensing electrode P-SE3, a plurality of second pads PD2, and a plurality of third pads PD3.

An active region AA and a peripheral region NAA adjacent to the active region AA may be defined in the base layer BSL. When viewed from above the plane, the active region AA may overlap the display region DA (refer to FIG. 6), and the peripheral region NAA may overlap the non-display region NDA (refer to FIG. 6).

The plurality of sensing electrodes SE1 and SE2 may be disposed in the active region AA, and the second and third pads PD2 and PD3 may be disposed in the peripheral region NAA. The second pads PD2 and the third pads PD3 may be adjacent to a lower end of the input sensor unit ISP when viewed from above the plane.

For example, the second pads PD2 may be disposed adjacent to a left side of the input sensor unit ISP, and the third pads PD3 may be disposed adjacent to a right side of the input sensor unit ISP. The first pads PD1 (refer to FIG. 6) may be disposed between the second pads PD2 and the third pads PD3 when viewed from above the plane.

Although FIG. 8A illustrates an example that the second pads PD2 and the third pads PD3 are formed on the base layer BSL, an arrangement relationship between the second pads PD2 and the third pads PD3 according to an embodiment of the present disclosure is not limited thereto. For example, the second pads PD2 and the third pads PD3 may be disposed in the non-display region NDA (refer to FIG. 6) adjacent to the lower end of the display panel DP (refer to FIG. 6) and may be spaced apart from each other with the first pads PD1 therebetween. The second pads PD2 and the third pads PD3 may be electrically connected to the input sensor unit ISP through contact holes.

The sensing electrodes SE1 and SE2 may include the plurality of first sensing electrodes SE1 that extend in the first direction DR1 and that are arranged in the second direction DR2 and the plurality of second sensing electrodes SE2 that extend in the second direction DR2 and that are arranged in the first direction DR1. The second sensing electrodes SE2 may extend across the first sensing electrodes SE1 while being insulated from the first sensing electrodes SE1. The first and second sensing electrodes SE1 and SE2 may sense the above-described second input.

The sensing lines TL and RL may be connected to first ends of the first and second sensing electrodes SE1 and SE2, respectively. The sensing lines TL and RL may extend to the peripheral region NAA and may be connected to the second and third pads PD2 and PD3, respectively. The sensing lines TL and RL may include the plurality of first sensing lines TL connected to the first sensing electrodes SE1, respectively, and the plurality of second sensing lines RL connected to the second sensing electrodes SE2, respectively.

The first sensing lines TL may be connected to lower ends of the first sensing electrodes SE1. The first sensing lines TL may extend to the peripheral region NAA and may be connected to corresponding second and third pads PD2 and PD3, respectively.

The input sensor unit ISP may be divided into a left part and a right part with respect to the center of the input sensor unit ISP in the second direction DR2. The first sensing lines TL connected to the first sensing electrodes SE1 disposed in the left part may be connected to the corresponding second pads PD2. The first sensing lines TL connected to the first sensing electrodes SE1 disposed in the right part may be connected to the corresponding third pads PD3.

The second sensing lines RL may be connected to left ends or right ends of the second sensing electrodes SE2. The second sensing lines RL may extend to the peripheral region NAA and may be connected to corresponding second and third pads PD2 and PD3.

The input sensor unit ISP may be divided into a lower part and an upper part with respect to the center of the input sensor unit ISP in the first direction DR1. The second sensing lines RL disposed in the lower part of the input sensor unit ISP may be connected to the left ends of the second sensing electrodes SE2 disposed in the lower part of the input sensor unit ISP. The second sensing lines RL disposed in the upper part of the input sensor unit ISP may be connected to the right ends of the second sensing electrodes SE2 disposed in the upper part of the input sensor unit ISP.

The second sensing lines RL disposed in the lower part of the input sensor unit ISP may be connected to the corresponding second pads PD2, respectively. The second sensing lines RL disposed in the upper part of the input sensor unit ISP may be connected to the corresponding third pads PD3, respectively.

Each of the first sensing electrodes SE1 may include a sensing electrode 1-1 SE1-1 (i.e., a 1-1 first sensing electrode SE1-1 of a pair of first sensing electrodes) and a sensing electrode 1-2 SE1-2 (i.e., a 1-2 first sensing electrode of the pair of first sensing electrodes) that extend in the first direction DR1 and that are spaced apart from each other in the second direction DR2. The sensing electrode 1-1 SE1-1 and the sensing electrode 1-2 SE1-2 may have shapes symmetrical to each other in the second direction DR2.

A lower end of the sensing electrode 1-1 SE1-1 and a lower end of the sensing electrode 1-2 SE1-2 in each of the first sensing electrodes SE1 may be connected to a corresponding first sensing line TL among the first sensing lines TL. An upper end of the sensing electrode 1-1 SE1-1 and an upper end of the sensing electrode 1-2 SE1-2 in each of the first sensing electrodes SE1 may not be connected with each other.

Each of the second sensing electrodes SE2 may include a sensing electrode 2-1 SE2-1 and a sensing electrode 2-2 SE2-2 that extend in the second direction DR2 and that are spaced apart from each other in the first direction DR1. The sensing electrode 2-1 SE2-1 and the sensing electrode 2-2 SE2-2 may have shapes symmetrical to each other in the first direction DR1.

A left end of the sensing electrode 2-1 SE2-1 and a left end of the sensing electrode 2-2 SE2-2 in each of the second sensing electrodes SE2 disposed in the lower part of the input sensor unit ISP may be connected to corresponding second sensing lines RL among the second sensing lines RL. In this case, the second sensing electrodes SE2 may be connected, through contact holes CNT, to the corresponding second sensing lines RL formed in different layers. A right end of the sensing electrode 2-1 SE2-1 and a right end of the sensing electrode 2-2 SE2-2 in each of the second sensing electrodes SE2 disposed in the lower part of the input sensor unit ISP may not be connected with each other.

A right end of the sensing electrode 2-1 SE2-1 and a right end of the sensing electrode 2-2 SE2-2 in each of the second sensing electrodes SE2 disposed in the upper part of the input sensor unit ISP may be connected to corresponding second sensing lines RL among the second sensing lines RL. In this case, the second sensing electrodes SE2 may be connected, through contact holes CNT, to the corresponding second sensing lines RL formed in different layers. A left end of the sensing electrode 2-1 SE2-1 and a left end of the sensing electrode 2-2 SE2-2 in each of the second sensing electrodes SE2 disposed in the upper part of the input sensor unit ISP may not be connected with each other.

For example, the first sensing lines TL, when viewed from above the plane, may be disposed in the peripheral region NAA adjacent to a lower side of the active region AA. Furthermore, the second sensing lines RL, when viewed from above the plane, may be disposed in the peripheral region NAA adjacent to a left side and a right side of the active region AA.

The pen sensing electrodes P-SE1 and P-SE2 may be disposed in the active region AA. The pen sensing lines PSL1, PSL2, and PSL3 may be connected to the pen sensing electrodes P-SE1 and P-SE2. The pen sensing lines PSL1, PSL2, and PSL3 may extend to the peripheral region and may be connected to corresponding second and third pads PD2 and PD3.

Although not illustrated, a sensing IC for controlling the input sensor unit ISP may be connected to the second and third pads PD2 and PD3 through a printed circuit board.

The pen sensing electrodes P-SE1 and P-SE2 may include the plurality of first pen sensing electrodes P-SE1 that extend in the first direction DR1 and that are arranged in the second direction DR2 and the plurality of second pen sensing electrodes P-SE2 that extend in the second direction DR2 and that are arranged in the first direction DR1. The first and second pen sensing electrodes P-SE1 and P-SE2 may sense the above-described first input.

The second pen sensing electrodes P-SE2 may extend across the first pen sensing electrodes P-SE1 while being insulated from the first pen sensing electrodes P-SE1. The first pen sensing electrodes P-SE1 may extend across the second sensing electrodes SE2 while being insulated from the second sensing electrodes SE2. The second pen sensing electrodes P-SE2 may extend across the first sensing electrodes SE1 while being insulated from the first sensing electrodes SE1.

Each of the first pen sensing electrodes P-SE1 may be disposed between the sensing electrode 1-1 SE1-1 and the sensing electrode 1-2 SE1-2 of the corresponding first sensing electrode SE1 among the first sensing electrodes SE1. Each of the second pen sensing electrodes P-SE2 may be disposed between the sensing electrode 2-1 SE2-1 and the sensing electrode 2-2 SE2-2 of the corresponding second sensing electrode SE2 among the second sensing electrodes SE2.

The first pen sensing electrodes P-SE1 may be disposed in the same layer as the first sensing electrodes SE1.

Upper ends of the first pen sensing electrodes P-SE1 may be connected with each other. Lower ends of the first pen sensing electrodes P-SE1 may be paired and connected with each other. That is, the lower ends of two first pen sensing electrodes P-SE1 adjacent to each other may be connected with each other.

The pen sensing lines PSL1, PSL2, and PSL3 may include the plurality of first pen sensing lines PSL1, the plurality of second pen sensing lines PSL2, and the plurality of third pen sensing lines PSL3. The first pen sensing lines PSL1 and the third pen sensing lines PSL3 may be connected to the first pen sensing electrodes P-SE1. The second pen sensing lines PSL2 may be connected to the second pen sensing electrodes P-SE2.

Left ends of the second pen sensing electrodes P-SE2 disposed in the lower part of the input sensor unit ISP may be connected to corresponding second pen sensing lines PSL2 among the second pen sensing lines PSL2. Right ends of the second pen sensing electrodes P-SE2 disposed in the lower part of the input sensor unit ISP may not be connected with each other. The second pen sensing lines PSL2 connected to the second pen sensing electrodes P-SE2 disposed in the lower part of the input sensor unit ISP may be connected to corresponding second pads PD2.

Right ends of the second pen sensing electrodes P-SE2 disposed in the upper part of the input sensor unit ISP may be connected to corresponding second pen sensing lines PSL2 among the second pen sensing lines PSL2. Left ends of the second pen sensing electrodes P-SE2 disposed in the upper part of the input sensor unit ISP may not be connected with each other. The second pen sensing lines PSL2 connected to the second pen sensing electrodes P-SE2 disposed in the upper part of the input sensor unit ISP may be connected to corresponding third pads PD3.

A pair of first pen sensing electrodes P-SE1 connected with each other at the lower ends thereof may be connected to a corresponding first pen sensing line PSL1 among the first pen sensing lines PSL1. The upper ends of the first pen sensing electrodes P-SE1 may be connected to the third pen sensing line PSL3 extending in the second direction DR2.

The peripheral pen sensing electrode P-SE3 may be disposed in the peripheral region NAA. The peripheral pen sensing electrode P-SE3 may extend in the first direction DR1. When viewed from above the plane, the area of the peripheral pen sensing electrode P-SE3 may be greater than the areas of the plurality of sensing lines TL and RL and the plurality of pen sensing lines PSL1, PSL2, and PSL3. A first width W1 (refer to FIG. 13) of each of the plurality of sensing lines TL and RL and the plurality of pen sensing lines PSL1, PSL2, and PSL3 in the second direction DR2 may be smaller than a second width W2 (refer to FIG. 13) of the peripheral pen sensing electrode P-SE3 in the second direction DR2. Description thereabout will be given below.

A plurality of peripheral pen sensing electrodes P-SE3 may be provided. The plurality of peripheral pen sensing electrodes P-SE3 may be spaced apart from each other in the second direction DR2 with the active region AA therebetween. The plurality of peripheral pen sensing electrodes P-SE3 may be connected to the third pen sensing line PSL3. That is, the plurality of peripheral pen sensing electrodes P-SE3 may be electrically connected to the first pen sensing electrode P-SE1.

One of the plurality of peripheral pen sensing electrodes P-SE3 may be disposed on a left side of the input sensor unit ISP and may be connected to a corresponding second pad PD2. The other one of the plurality of peripheral pen sensing electrodes P-SE3 may be disposed on a right side of the input sensor unit ISP and may be connected to a corresponding third pad PD3.

Although a timing chart is not illustrated, for example, the input sensor unit ISP may be driven in a time-sharing manner and may be driven in a first sensing section and a second sensing section. The first sensing section and the second sensing section may be repeated. During the first sensing section, the first and second sensing electrodes SE1 and SE2 may be driven, and the second input by a touch of the user may be sensed. During the second sensing section, the first input by the input device PN may be sensed by the first and second pen sensing electrodes P-SE1 and P-SE2. An operation of sensing the first input of the input device PN will be described below in detail.

According to the present disclosure, since the second input by a touch of the user and the first input of the input device PN (refer to FIG. 1) are sensed by the same input sensor unit ISP, two input devices such as a touch panel and a digitizer do not need to be used, and thus the thickness of the display device DD (refer to FIG. 1) may be decreased.

Although sixth first pen sensing electrodes P-SE1 and eight second pen sensing electrodes P-SE2 are illustrated, the numbers of first pen sensing electrodes P-SE1 and second pen sensing electrodes P-SE2 according to an embodiment of the present disclosure are not limited thereto. Substantially, the input sensor unit ISP may include more first pen sensing electrodes P-SE1 and more second pen sensing electrodes P-SE2. In some embodiments, the peripheral pen sensing electrode P-SE3 may have a larger area than the plurality of lines (RL, PLS1, PLS2, and PLS3) when viewed from above the plane.

Figure 8B:
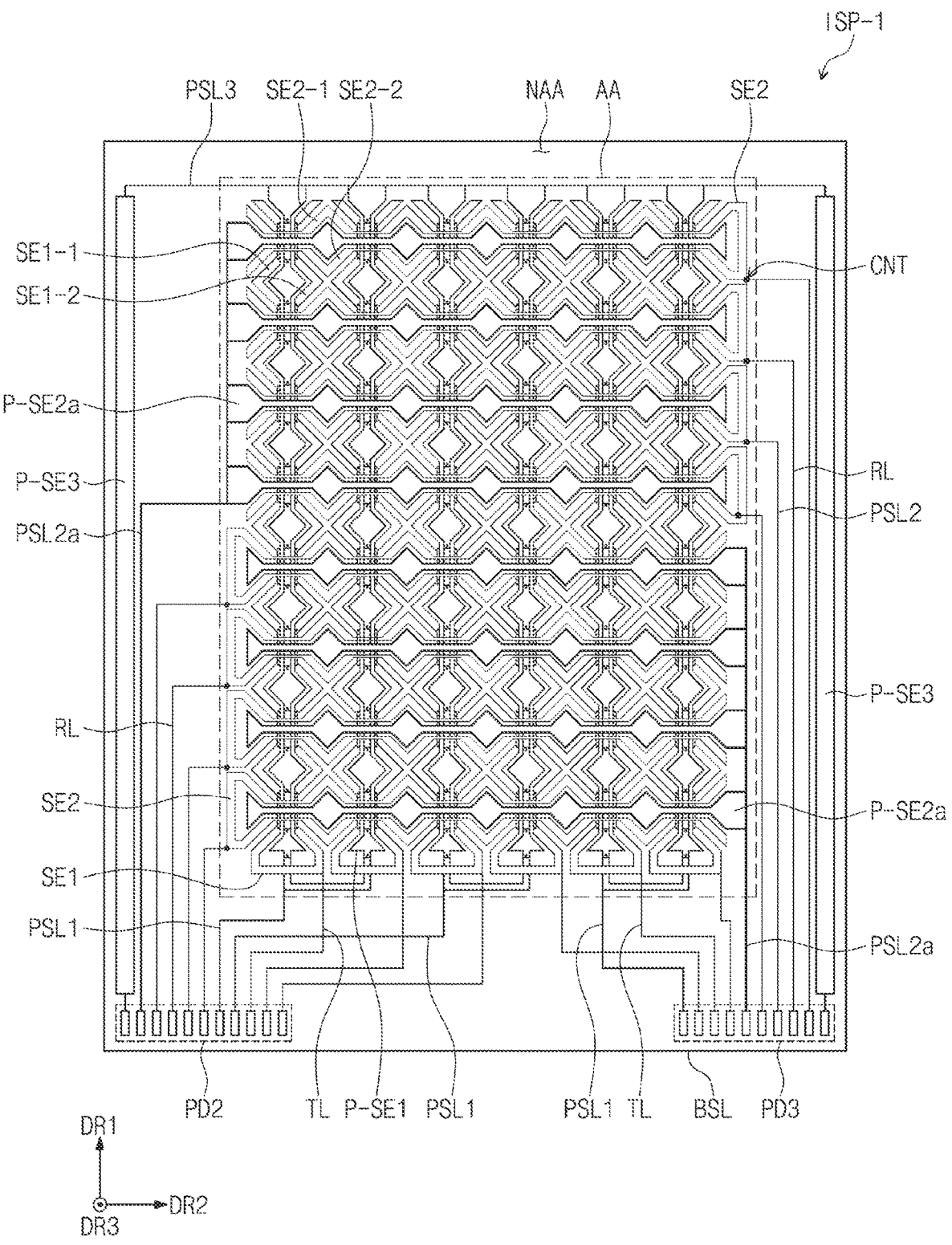
FIG. 8B is a plan view illustrating an input sensor unit according to an embodiment of the present disclosure.

FIG. 8B is a plan view illustrating an input sensor unit according to an embodiment of the present disclosure. In describing FIG. 8, components identical to the components described with reference to FIG. 8A will be assigned with identical reference numerals, and descriptions thereof will be omitted.

Referring to FIG. 8B, second pen sensing electrodes P-SE2a may extend across first pen sensing electrodes P-SE1 while being insulated from the first pen sensing electrodes P-SE1. The second pen sensing electrodes P-SE2a may extend across first sensing electrodes SE1 while being insulated from the first sensing electrodes SE1.

Left ends of the second pen sensing electrodes P-SE2a disposed in an upper part of the input sensor unit ISP-1 may be connected with each other. Right ends of the second pen sensing electrodes P-SE2a disposed in a lower part of the input sensor unit ISP-1 may be connected with each other.

Right ends of the second pen sensing electrodes P-SE2a disposed in the upper part of the input sensor unit ISP-1 may not be connected with each other. Left ends of the second pen sensing electrodes P-SE2a disposed in the lower part of the input sensor unit ISP-1 may not be connected with each other.

The left ends of the second pen sensing electrodes P-SE2a disposed in the upper part of the input sensor unit ISP-1 may be connected to a corresponding second pen sensing line PSL2a among second pen sensing lines PSL2a. The second pen sensing line PSL2a connected to the second pen sensing electrodes P-SE2a disposed in the upper part of the input sensor unit ISP-1 may be connected to a corresponding second pad PD2.

The right ends of the second pen sensing electrodes P-SE2a disposed in the lower part of the input sensor unit ISP-1 may be connected to a corresponding second pen sensing line PSL2a among the second pen sensing lines PSL2a. The second pen sensing lines PSL2a connected to the second pen sensing electrodes P-SE2a disposed in the lower part of the input sensor unit ISP-1 may be connected to a corresponding third pad PD3.

Figure 9:
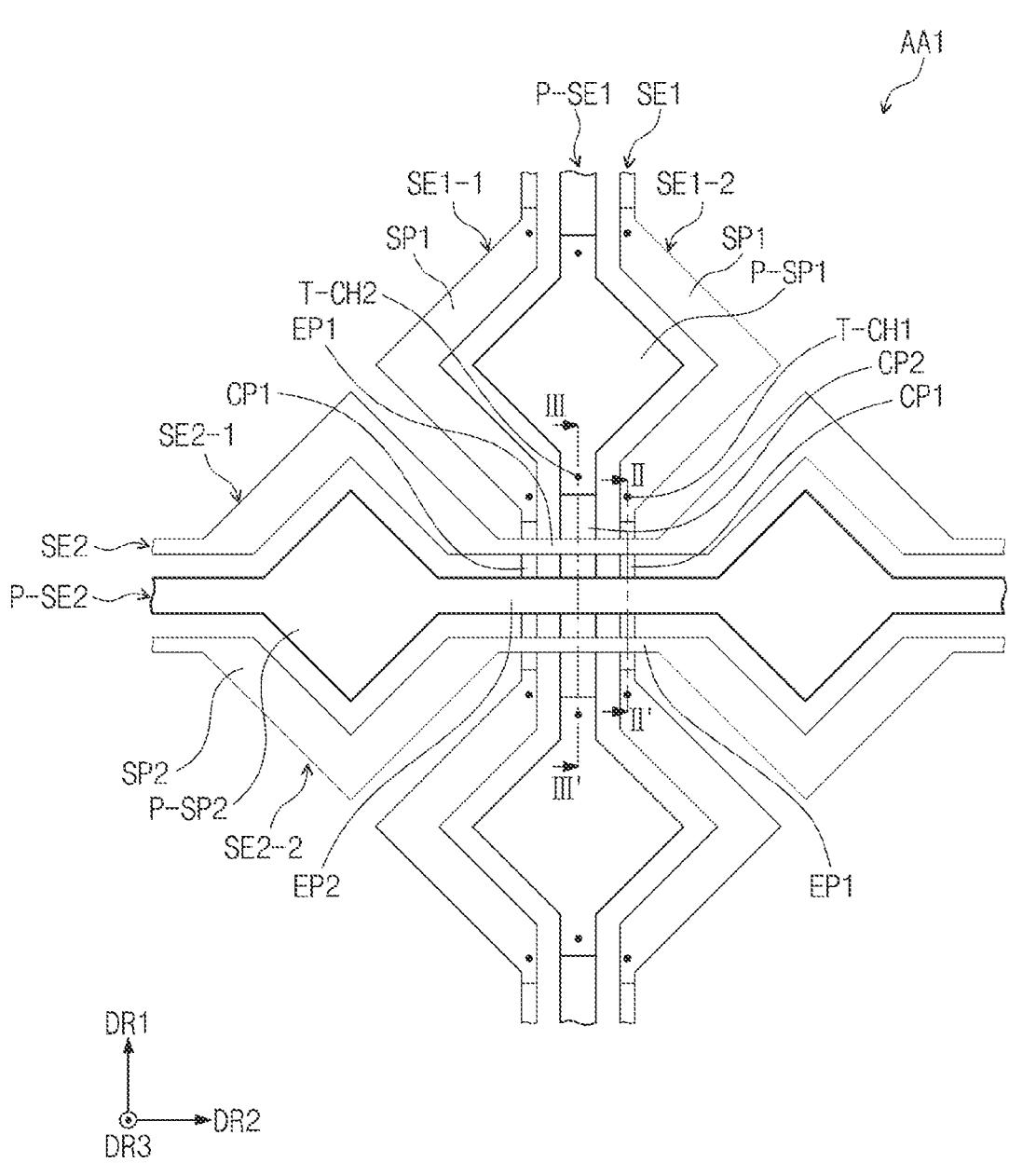
FIG. 9 is an enlarged plan view illustrating region AA1 of FIGS. 8A and 8B according to an embodiment of the present disclosure.

FIG. 9 is an enlarged plan view illustrating region AA1 of FIGS. 8A and 8B according to an embodiment of the present disclosure.

Referring to FIGS. 8A and 9, each of the sensing electrode 1-1 SE1-1 and the sensing electrode 1-2 SE1-2 may include a plurality of first sensing parts SP1 arranged in the first direction DR1 and a plurality of first connecting patterns CP1 connecting the first sensing parts SP1.

The first sensing parts SP1 may have a bent shape. For example, the first sensing parts SP1 of the sensing electrode 1-1 SE1-1 and the first sensing parts SP1 of the sensing electrode 1-2 SE1-2 may have a shape bent toward the outside.

The first connecting patterns CP1 may extend in the first direction DR1. The first connecting patterns CP1 may be disposed between the first sensing parts SP1 and may be connected to the first sensing parts SP1. The first sensing parts SP1 may be connected through the first connecting patterns CP1.

Each of the first connecting patterns CP1 may be disposed between two first sensing parts SP1 adjacent to each other in the first direction DR1 and may connect the two first sensing parts SP1. The insulating layer TINS (refer to FIG. 11) may be disposed between the first connecting patterns CP1 and the first sensing parts SP1, and the first connecting patterns CP1 may be connected to the first sensing parts SP1 through first contact holes T-CH1 defined in the insulating layer TINS.

Each of the sensing electrode 2-1 SE2-1 and the sensing electrode 2-2 SE2-2 may include a plurality of second sensing parts SP2 arranged in the second direction DR2 and a plurality of first extending patterns EP1 extending from the second sensing parts SP2 in the second direction DR2. The first extending patterns EP1 may extend across the first connecting patterns CP1 when viewed from above the plane.

The second sensing parts SP2 may have a bent shape. For example, the second sensing parts SP2 of the sensing electrode 2-1 SE2-1 and the second sensing parts SP2 of the sensing electrode 2-2 SE2-2 may have a shape bent toward the outside.

In each of the sensing electrode 2-1 SE2-1 and the sensing electrode 2-2 SE2-2, the first extending patterns EP1 may be integrally formed with the second sensing parts SP2. Each of the first extending patterns EP1 may be disposed between two second sensing parts SP2 adjacent to each other in the second direction DR2 and may extend from the two second sensing parts SP2.

The first sensing parts SP1 and the second sensing parts SP2 may be spaced apart from each other without overlapping each other and may be alternately disposed. Capacitance may be formed by the first sensing parts SP1 and the second sensing parts SP2.

The first and second sensing parts SP1 and SP2 and the first extending patterns EP1 may be disposed in the same layer. The first connecting patterns CP1 may be disposed in a layer different from the layer in which the first and second sensing parts SP1 and SP2 and the first extending patterns EP1 are disposed. The first connecting patterns CP1 may be disposed below the first and second sensing parts SP1 and SP2 and the first extending patterns EP1.

Each of the first pen sensing electrodes P-SE1 may include a plurality of first pen sensing parts P-SP1 arranged in the first direction DR1 and a plurality of second connecting patterns CP2 that connect the first pen sensing parts P-SP1.

The first pen sensing parts P-SP1 may have a rhombic shape. However, the shape of the first pen sensing parts P-SP1 is not limited thereto. The second connecting patterns CP2 may extend in the first direction DR1. The second connecting patterns CP2 may be disposed between the first pen sensing parts P-SP1 and may be connected to the first pen sensing parts P-SP1. The first pen sensing parts P-SP1 may be connected through the second connecting patterns CP2.

Each of the second connecting patterns CP2 may be disposed between two first pen sensing parts P-SP1 adjacent to each other in the first direction DR1 and may connect the two first pen sensing parts P-SP1. The insulating layer TINS (refer to FIG. 12) may be disposed between the second connecting patterns CP2 and the first pen sensing parts P-SP1, and the second connecting patterns CP2 may be connected to the first pen sensing parts P-SP1 through second contact holes T-CH2 defined in the insulating layer TINS.

Each of the second pen sensing electrodes P-SE2 may include a plurality of second pen sensing parts P-SP2 arranged in the second direction DR2 and a plurality of second extending patterns EP2 that extend from the second pen sensing parts P-SP2 in the second direction DR2. The first and second extending patterns EP1 and EP2 may extend across the first and second connecting patterns CP1 and CP2 when viewed from above the plane.

The second pen sensing parts P-SP2 may have a rhombic shape. However, the shape of the second pen sensing parts P-SP2 is not limited thereto. The second extending patterns EP2 may be integrally formed with the second pen sensing parts P-SP2. Each of the second extending patterns EP2 may be disposed between two second pen sensing parts P-SP2 adjacent to each other in the second direction DR2 and may extend from the two second pen sensing parts P-SP2.

The first pen sensing parts P-SP1, the second pen sensing parts P-SP2, and the second extending patterns EP2 may be disposed in the same layer as the first and second sensing parts SP1 and SP2 and the first extending patterns EP1. The second connecting patterns CP2 may be disposed in the same layer as the first connecting patterns CP1.

The first sensing lines TL and the first pen sensing lines PSL1 may extend across each other while being insulated from each other. The first sensing lines TL may be integrally formed with the first sensing parts SP1 adjacent to the lower side of the active region AA and may extend from the first sensing parts SP1. The first pen sensing lines PSL1 may be integrally formed with the second connecting patterns CP2 adjacent to the lower side of the active region AA and may extend from the second connecting patterns CP2.

The first pen sensing lines PSL1 may be disposed below the first sensing lines TL. An insulating layer may be disposed between the first pen sensing lines PSL1 and the first sensing lines TL.

Figure 10:
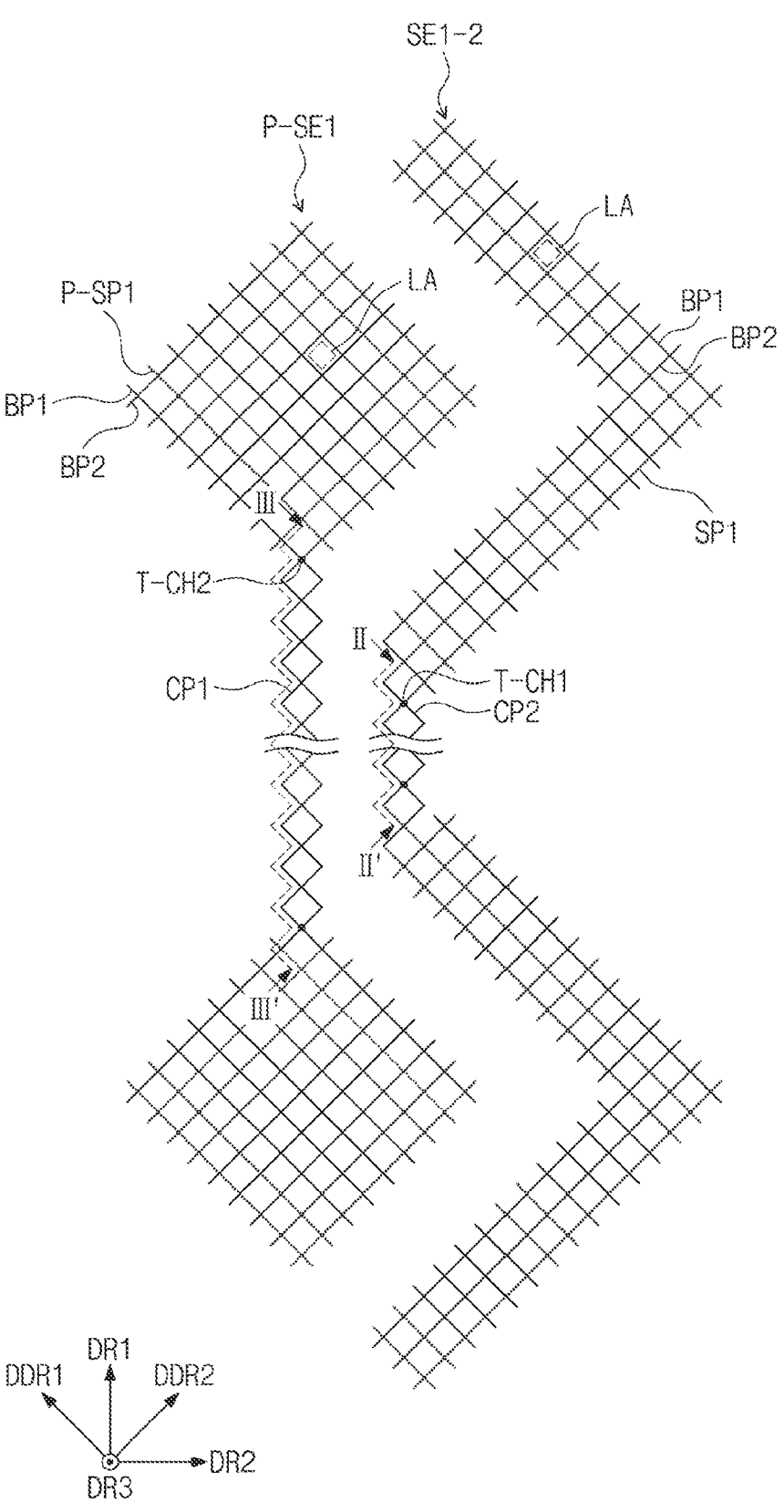
FIG. 10 is a plan view illustrating a first pen sensing electrode and a sensing electrode 1-2 according to an embodiment of the present disclosure.

FIG. 10 is a plan view illustrating a first pen sensing electrode and a sensing electrode 1-2 according to an embodiment of the present disclosure.

Referring to FIGS. 9 and 10, the first pen sensing electrode P-SE1 and the sensing electrode 1-2 SE1-2 may have a mesh shape. For example, each of the first pen sensing electrode P-SE1 and the sensing electrode 1-2 SE1-2 may include a plurality of first branch parts BP1 extending in a first diagonal direction DDR1 and a plurality of second branch parts BP2 extending in a second diagonal direction DDR2.

The first diagonal direction DDR1 may be defined as a direction crossing the first and second directions DR1 and DR2 on the plane defined by the first and second directions DR1 and DR2. The second diagonal direction DDR2 may be defined as a direction crossing the first diagonal direction DDR1 on the plane defined by the first and second directions DR1 and DR2.

The first and second branch parts BP1 and BP2 may cross each other and may be integrally formed with each other. The mesh shape of the first pen sensing electrode P-SE1 and the sensing electrode 1-2 SE1-2 may be defined by the first and second branch parts BP1 and BP2.

Although not illustrated in FIG. 10, the sensing electrode 1-1 SE1-1, the second pen sensing electrode P-SE2, the sensing electrode 2-1 SE2-1, and the sensing electrode 2-2 SE2-2 illustrated in FIG. 9 may have the same mesh shape as the components illustrated in FIG. 10.

Openings having a rhombic shape may be defined by the first and second branch parts BP1 and BP2. The emissive regions LA of the pixels PX (refer to FIG. 7) may be disposed in the openings, respectively. Accordingly, the first and second branch parts BP1 and BP2 may overlap the non-emissive region NLA (refer to FIG. 7). That is, the sensing electrode 1-2 SE1-2 and the second pen sensing electrode P-SE2 may overlap the non-emissive region NLA (refer to FIG. 7).

Since the first and second branch parts BP1 and BP2 are disposed in the non-emissive region NLA (refer to FIG. 7), light generated from the light emitting elements OLED (refer to FIG. 7) of the pixels PX (refer to FIG. 7) may be normally output without being affected by the sensing electrode 1-2 SE1-2 and the second pen sensing electrode P-SE2.

Figure 11:
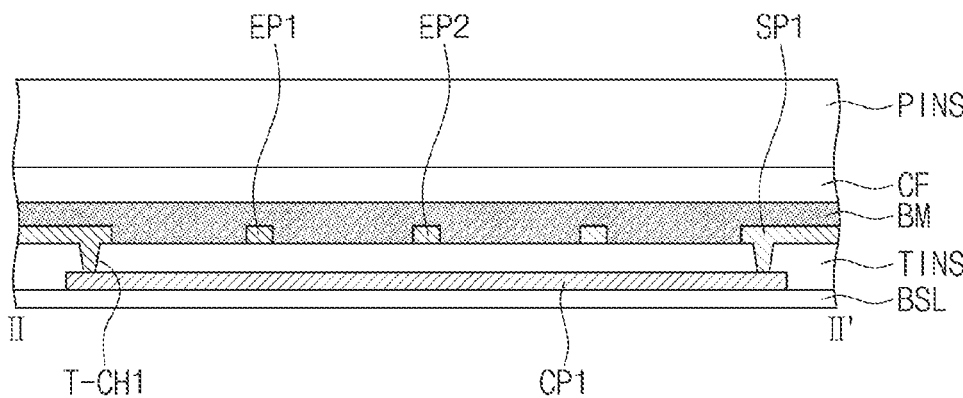
FIG. 11 is a sectional view taken along line II-II' of FIGS. 9 and 10 according to an embodiment of the present disclosure.
Figure 12:
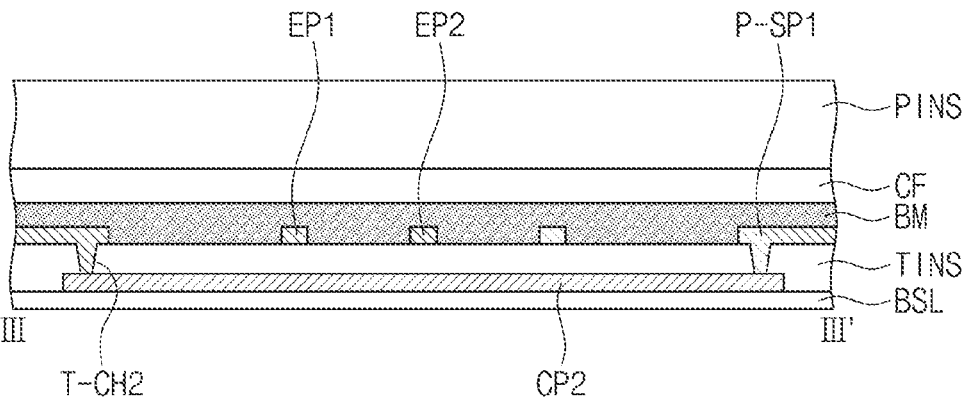
FIG. 12 is a sectional view taken along line III-III' of FIGS. 9 and 10 according to an embodiment of the present disclosure.

FIG. 11 is a sectional view taken along line II-II' of FIGS. 9 and 10 according to an embodiment of the present disclosure, and FIG. 12 is a sectional view taken along line III-III' of FIGS. 9 and 10 according to an embodiment of the present disclosure.

Lines II-II' and III-III' illustrated in FIG. 9 may correspond to lines II-II' and III-III' in the mesh shape illustrated in FIG. 10.

Referring to FIGS. 11 and 12, the first connecting pattern CP1 and the second connecting pattern CP2 may be disposed on the base layer BSL. The first connecting pattern CP1 and the second connecting pattern CP2 may be formed by the above-described first conductive pattern CTL1 (refer to FIG. 7).

The insulating layer TINS may be disposed on the base layer BSL. The insulating layer TINS may cover the first and second connecting patterns CP1 and CP2. The first sensing parts SP1, the first pen sensing parts P-SP1, and the first and second extending patterns EP1 and EP2 may be disposed on the insulating layer TINS. Although not illustrated, the second sensing parts SP2 integrally formed with the first extending patterns EP1 and the second pen sensing parts P-SP2 integrally formed with the second extending patterns EP2 may be disposed on the insulating layer TINS.

The first sensing parts SP1 may be connected to the first connecting pattern CP1 through the first contact holes T-CH1 defined in the insulating layer TINS. The first pen sensing parts P-SP1 may be connected to the second connecting pattern CP2 through the second contact holes T-CH2 defined in the insulating layer TINS.

The black matrix BM may be formed on the insulating layer TINS to cover the first sensing parts SP1, the first pen sensing parts P-SP1, and the first and second extending patterns EP1 and EP2. The color filter CF may be disposed on the black matrix BM, and the planarization insulating layer PINS may be disposed on the color filter CF.

Figure 13:
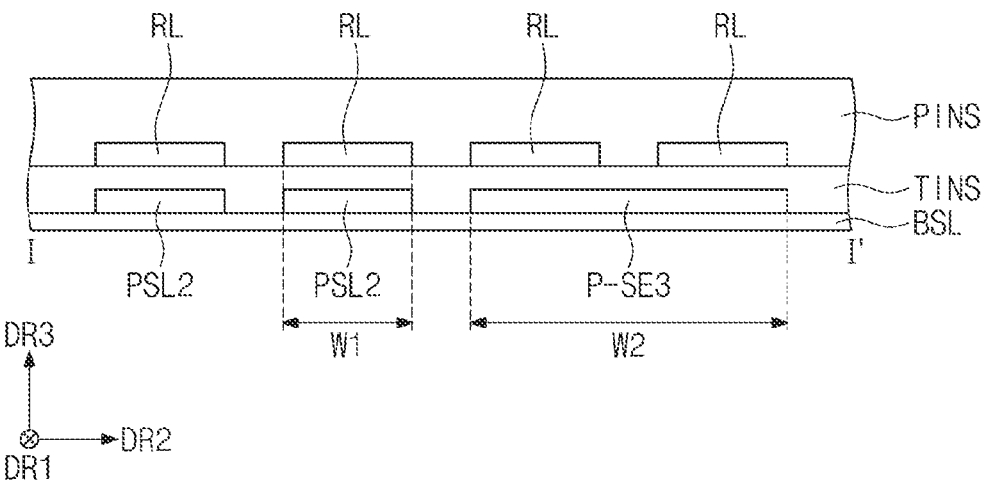
FIG. 13 is a sectional view taken along line I-I' of FIG. 8A according to an embodiment of the present disclosure.

FIG. 13 is a sectional view taken along line I-I' of FIG. 8A according to an embodiment of the present disclosure.

Referring to FIGS. 8A and 13, the plurality of second pen sensing lines PSL2 and the peripheral pen sensing electrode P-SE3 may be disposed on the base layer BSL. The plurality of second pen sensing lines PSL2 and the peripheral pen sensing electrode P-SE3 may be formed by the above-described first conductive pattern CTL1 (refer to FIG. 7). Although not illustrated, the remaining pen sensing lines PSL1, PSL2, and PSL3 may also be disposed on the base layer BSL.

The plurality of pen sensing lines PSL1, PSL2, and PSL3 and the peripheral pen sensing electrode P-SE3 may be disposed in the same layer.

The insulating layer TINS may be disposed on the base layer BSL. The insulating layer TINS may cover the plurality of second pen sensing lines PSL2 and the peripheral pen sensing electrode P-SE3.

The plurality of second sensing lines RL may be disposed on the insulating layer TINS. The plurality of second sensing lines RL may be formed by the above-described second conductive pattern CTL2 (refer to FIG. 7).

The plurality of second sensing lines RL may be disposed in the same layer. The planarization insulating layer PINS may be disposed on the plurality of second sensing lines RL.

The plurality of pen sensing lines PSL1, PSL2, and PSL3 and the peripheral pen sensing electrode P-SE3 may be disposed in a layer different from the layer in which the second sensing lines RL are disposed. Accordingly, a space in which the peripheral pen sensing electrode P-SE3 having a relatively large width is disposed may be secured in the base layer BSL.

The second sensing lines RL may overlap the plurality of pen sensing lines PSL1, PSL2, and PSL3, respectively, when viewed from above the plane.

The plurality of sensing lines TL and RL and the plurality of pen sensing lines PSL1, PSL2, and PSL3 may have the same first width W1 in the second direction DR2.

The second sensing lines RL may overlap the peripheral pen sensing electrode P-SE3 when viewed from above the plane.

The peripheral pen sensing electrode P-SE3 may have the second width W2 in the second direction DR2. The second width W2 may be greater than the first width W1. That is, when viewed from above the plane, the area of the peripheral pen sensing electrode P-SE3 may be greater than the areas of the plurality of sensing lines TL and RL and the plurality of pen sensing lines PSL1, PSL2, and PSL3.

According to the present disclosure, the area of the peripheral pen sensing electrode P-SE3 may be relatively wide. The wide area of the peripheral pen sensing electrode P-SE3 may reduce the resistance of the peripheral pen sensing electrode P-SE3, and the amount of drive current I (refer to FIG. 21A) provided to the peripheral pen sensing electrode P-SE3 may be increased. Charging sensitivity may be improved when the input device PN is disposed on the active region AA adjacent to the peripheral region NAA. Accordingly, the display device DD (refer to FIG. 1) having improved sensing reliability may be provided.

Figure 14:
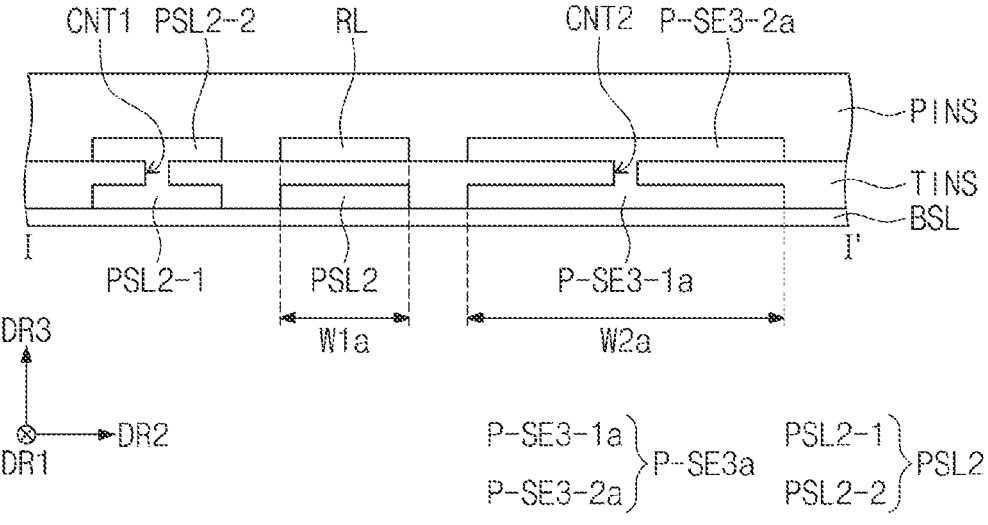
FIG. 14 is a sectional view taken along a line corresponding to line I-I' of FIG. 8A according to an embodiment of the present disclosure.

FIG. 14 is a sectional view taken along a line corresponding to line I-I' of FIG. 8A according to an embodiment of the present disclosure.

Referring to FIGS. 8A and 14, at least one of the second pen sensing lines PSL2 may include a first pen sensing line part PSL2-1 and a second pen sensing line part PSL2-2. A peripheral pen sensing electrode P-SE3a may include a first sensing part P-SE3-1a and a second sensing part P-SE3-2a.

The first pen sensing line part PSL2-1 and the first sensing part P-SE3-1a may be disposed on the base layer BSL. The rest of the second pen sensing lines PSL2 may also be disposed on the base layer BSL. The first pen sensing line part PSL2-1, the first sensing part P-SE3-1a, and the rest of the second pen sensing lines PSL2 may be formed by the above-described first conductive pattern CTL1 (refer to FIG. 7).

The first pen sensing line part PSL2-1, the first sensing part P-SE3-1a, and the rest of the second pen sensing lines PSL2 may be disposed in the same layer.

The insulating layer TINS may be disposed on the base layer BSL. The insulating layer TINS may cover the first pen sensing line part PSL2-1, the first sensing part P-SE3-1a, and the rest of the second pen sensing lines PSL2.

The second sensing lines RL, the second pen sensing line part PSL2-2, and the second sensing part P-SE3-2a may be disposed on the insulating layer TINS. The second sensing lines RL, the second pen sensing line part PSL2-2, and the second sensing part P-SE3-2a may be formed by the above-described second conductive pattern CTL2 (refer to FIG. 7).

The second sensing lines RL, the second pen sensing line part PSL2-2, and the second sensing part P-SE3-2a may be disposed in the same layer. The planarization insulating layer PINS may be disposed on the plurality of second sensing lines RL.

A first contact hole CNT1 and a second contact hole CNT2 may be defined in the insulating layer TINS.

The first pen sensing line part PSL2-1 and the second pen sensing line part PSL2-2 may be electrically connected with each other through the first contact hole CNT1. A wiring area may be substantially increased by the first pen sensing line part PSL2-1 and the second pen sensing line part PSL2-2, and thus the resistance of the first pen sensing line PSL1 may be decreased.

The first sensing part P-SE3-1a and the second sensing part P-SE3-2a may be electrically connected with each other through the second contact hole CNT2. A wiring area may be substantially increased by the first sensing part P-SE3-1a and the second sensing part P-SE3-2a, and thus the resistance of the peripheral pen sensing electrode P-SE3a may be decreased.

The plurality of sensing lines TL and RL and the plurality of pen sensing lines PSL1, PSL2, and PSL3 may have the same first width W1a in the second direction DR2.

Each of the first sensing part P-SE3-1a and the second sensing part P-SE3-2a may have a second width W2a in the second direction DR2. The second width W2a may be greater than the first width W1a. That is, when viewed from above the plane, the areas of the first sensing part P-SE3-1a and the second sensing part P-SE3-2a may be greater than the areas of the plurality of sensing lines TL and RL and the plurality of pen sensing lines PSL1, PSL2, and PSL3.

According to the present disclosure, the area of the peripheral pen sensing electrode P-SE3a may be relatively wide, and the first sensing part P-SE3-1a and the second sensing part P-SE3-2a disposed in the different layers may be electrically connected with each other through the second contact hole CNT2. Such configuration of the peripheral pen sensing electrode P-SE3a may decrease the resistance, and the amount of drive current I (refer to FIG. 21A) provided to the peripheral pen sensing electrode P-SE3a may be increased. Charging sensitivity may be improved when the input device PN is disposed on the active region AA adjacent to the peripheral region NAA. Accordingly, the display device DD (refer to FIG. 1) having improved sensing reliability may be provided.

Figure 15:
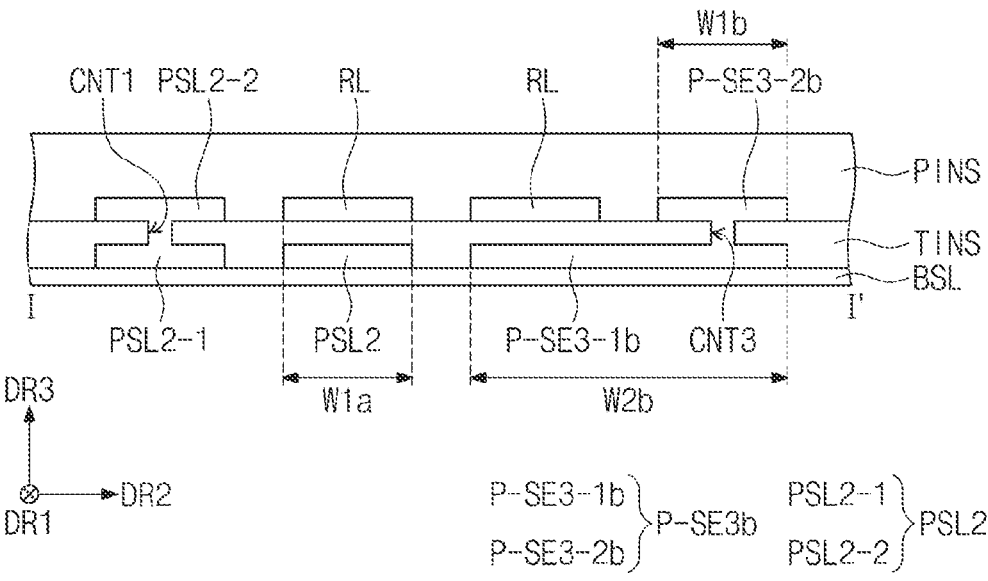
FIG. 15 is a sectional view taken along a line corresponding to line I-I' of FIG. 8A according to an embodiment of the present disclosure.

FIG. 15 is a sectional view taken along a line corresponding to line I-I' of FIG. 8A according to an embodiment of the present disclosure.

Referring to FIGS. 8A and 15, at least one of the second pen sensing lines PSL2 may include a first pen sensing line part PSL2-1 and a second pen sensing line part PSL2-2. A peripheral pen sensing electrode P-SE3b may include a first sensing part P-SE3-1b and a second sensing part P-SE3-2b.

The first pen sensing line part PSL2-1 and the first sensing part P-SE3-1b may be disposed on the base layer BSL. The rest of the second pen sensing lines PSL2 may also be disposed on the base layer BSL. The first pen sensing line part PSL2-1, the first sensing part P-SE3-1b, and the rest of the second pen sensing lines PSL2 may be formed by the above-described first conductive pattern CTL1 (refer to FIG. 7).

The first pen sensing line part PSL2-1, the first sensing part P-SE3-1*b*, and the rest of the second pen sensing lines PSL2 may be disposed in the same layer.

The insulating layer TINS may be disposed on the base layer BSL. The insulating layer TINS may cover the first pen sensing line part PSL2-1, the first sensing part P-SE3-1*b*, and the rest of the second pen sensing lines PSL2.

A first contact hole CNT1 may be defined in the insulating layer TINS.

The second sensing lines RL, the second pen sensing line part PSL2-2, and the second sensing part P-SE3-2*b* may be disposed on the insulating layer TINS. The second sensing lines RL, the second pen sensing line part PSL2-2, and the second sensing part P-SE3-2*b* may be formed by the above-described second conductive pattern CTL2 (refer to FIG. 7).

The second sensing lines RL, the second pen sensing line part PSL2-2, and the second sensing part P-SE3-2*b* may be disposed in the same layer. The planarization insulating layer PINS may be disposed on the plurality of second sensing lines RL.

The first pen sensing line part PSL2-1 and the second pen sensing line part PSL2-2 may be electrically connected with each other through the first contact hole CNT1. A wiring area may be substantially increased by the first pen sensing line part PSL2-1 and the second pen sensing line part PSL2-2, and thus the resistance of the second pen sensing line PSL2 may be decreased.

The first sensing part P-SE3-1*b* and the second sensing part P-SE3-2*b* may be electrically connected with each other through a third contact hole CNT3. A wiring area may be substantially increased by the first sensing part P-SE3-1*b* and the second sensing part P-SE3-2*b*, and thus the resistance of the peripheral pen sensing electrode P-SE3*b* may be decreased.

The width W2*b* of the first sensing part P-SE3-1*b* in the second direction DR2 may be greater than the width W1*b* of the second sensing part P-SE3-2*b* in the second direction DR2. When viewed from above the plane, the first sensing part P-SE3-1*b* may overlap the second sensing part P-SE3-2*b* and at least one of the plurality of sensing lines RL.

According to the present disclosure, the area of the peripheral pen sensing electrode P-SE3*b* may be relatively wide, and the first sensing part P-SE3-1*b* and the second sensing part P-SE3-2*b* disposed in the different layers may be electrically connected with each other through the third contact hole CNT3. Such configuration of the peripheral pen sensing electrode P-SE3*b* may reduce the resistance, and the amount of drive current I (refer to FIG. 21A) provided to the peripheral pen sensing electrode P-SE3*b* may be increased. Charging sensitivity may be improved when the input device PN is disposed on the active region AA adjacent to the peripheral region NAA. Accordingly, the display device DD (refer to FIG. 1) having improved sensing reliability may be provided.

Figure 16:
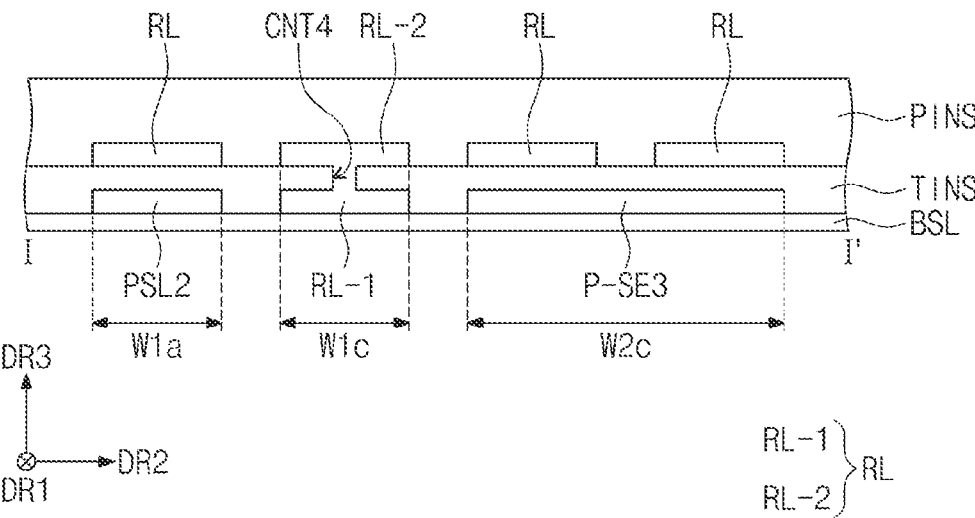
FIG. 16 is a sectional view taken along a line corresponding to line I-I' of FIG. 8A according to an embodiment of the present disclosure.

FIG. 16 is a sectional view taken along a line corresponding to line I-I' of FIG. 8A according to an embodiment of the present disclosure.

Referring to FIGS. 8A and 16, at least one of the second sensing lines RL may include a first line part RL-1 and a second line part RL-2.

The second pen sensing line PSL2, the first line part RL-1, and the peripheral pen sensing electrode P-SE3 may be disposed on the base layer BSL. The second pen sensing line PSL2, the first line part RL-1, and the peripheral pen sensing electrode P-SE3 may be formed by the above-described first conductive pattern CTL1 (refer to FIG. 7).

The second pen sensing line PSL2, the first line part RL-1, and the peripheral pen sensing electrode P-SE3 may be disposed in the same layer.

The insulating layer TINS may be disposed on the base layer BSL. The insulating layer TINS may cover the second pen sensing line PSL2, the first line part RL-1, and the peripheral pen sensing electrode P-SE3.

A fourth contact hole CNT4 may be defined in the insulating layer TINS.

The rest of the second sensing lines RL and the second line part RL-2 may be disposed on the insulating layer TINS. The rest of the second sensing lines RL and the second line part RL-2 may be formed by the above-described second conductive pattern CTL2 (refer to FIG. 7).

The rest of the second sensing lines RL and the second line part RL-2 may be disposed in the same layer. The planarization insulating layer PINS may be disposed on the plurality of second sensing lines RL.

The first line part RL-1 and the second line part RL-2 may be electrically connected with each other through the fourth contact hole CNT4. A wiring area may be substantially increased by the first line part RL-1 and the second line part RL-2, and thus the resistance of a part of the second sensing lines RL may be decreased.

The width W1*a* of the rest of the second sensing lines RL in the second direction DR2 may be equal to the width W1*c* of the first line part RL-1 and the second line part RL-2 in the second direction DR2. The first line part RL-1 and the second line part RL-2 may overlap each other when viewed from above the plane.

The peripheral pen sensing electrode P-SE3 may have a width W2*c* in the second direction DR2. The width W2*c* of the peripheral pen sensing electrode P-SE3 may be greater than the widths W1*a* and W1*c* of the second sensing lines RL.

According to the present disclosure, the area of the peripheral pen sensing electrode P-SE3 may be relatively wide. The wide area of the peripheral pen sensing electrode P-SE3 may reduce the resistance of the peripheral pen sensing electrode P-SE3, and the amount of drive current I (refer to FIG. 21A) provided to the peripheral pen sensing electrode P-SE3 may be increased. Charging sensitivity may be improved when the input device PN is disposed on the active region AA adjacent to the peripheral region NAA. Accordingly, the display device DD (refer to FIG. 1) having improved sensing reliability may be provided.

Figure 17:
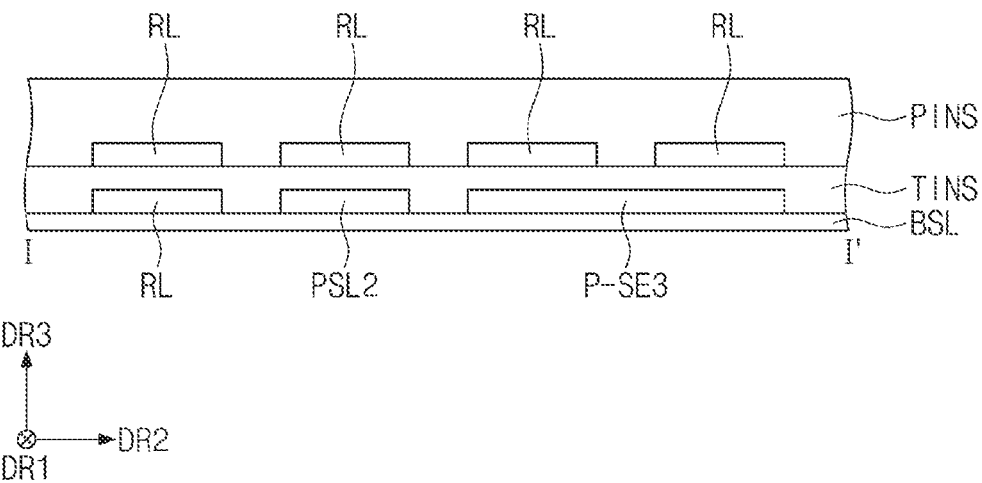
FIG. 17 is a sectional view taken along a line corresponding to line I-I' of FIG. 8A according to an embodiment of the present disclosure.

FIG. 17 is a sectional view taken along a line corresponding to line I-I' of FIG. 8A according to an embodiment of the present disclosure.

Referring to FIG. 17, the second pen sensing line PSL2, the peripheral pen sensing electrode P-SE3, and a second sensing line RL may be disposed on the base layer BSL. The second pen sensing line PSL2, the peripheral pen sensing electrode P-SE3, and the second sensing line RL may be formed by the above-described first conductive pattern CTL1 (refer to FIG. 7).

The plurality of pen sensing lines PSL1, PSL2, and PSL3, a plurality of second sensing lines RL, and the peripheral pen sensing electrode P-SE3 may be disposed in the same layer.

The insulating layer TINS may be disposed on the base layer BSL. The insulating layer TINS may cover the plurality of pen sensing lines PSL1, PSL2, and PSL3, the plurality of second sensing lines RL, and the peripheral pen sensing electrode P-SE3.

A plurality of second sensing lines RL may be disposed on the insulating layer TINS. The plurality of second sensing lines RL may be formed by the above-described second conductive pattern CTL2 (refer to FIG. 7).

Figure 18:
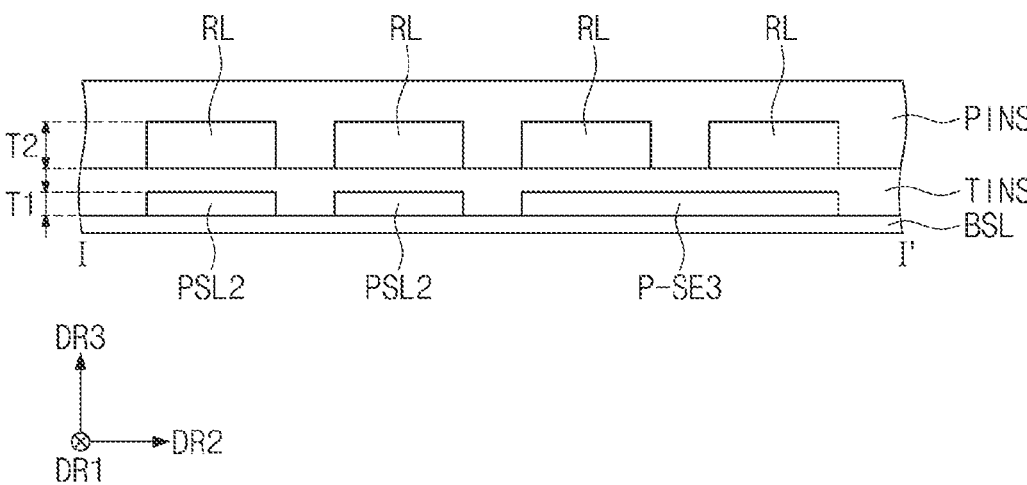
FIG. 18 is a sectional view taken along a line corresponding to line I-I' of FIG. 8A according to an embodiment of the present disclosure.

FIG. 18 is a sectional view taken along a line corresponding to line I-I' of FIG. 8A according to an embodiment of the present disclosure. In describing FIG. 18, components identical to the components described with reference to FIG. 13 will be assigned with identical reference numerals, and descriptions thereabout will be omitted.

Referring to FIG. 18, the plurality of second pen sensing lines PSL2 and the peripheral pen sensing electrode P-SE3 may have a first thickness T1 in a third direction DR3.

The plurality of second sensing lines RL may have a second thickness T2 in the third direction DR3. The second thickness T2 may be greater than the first thickness T1.

That is, the thickness of the components formed by the first conductive pattern CTL1 (refer to FIG. 7) may be smaller than the thickness of the components formed by the second conductive pattern CTL2 (refer to FIG. 7).

Figure 19:
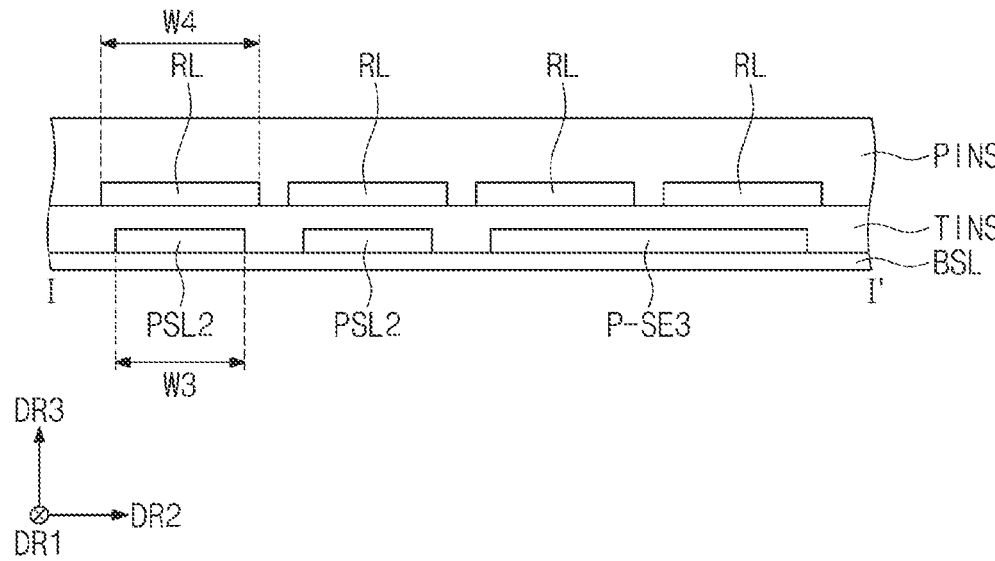
FIG. 19 is a sectional view taken along a line corresponding to line I-I' of FIG. 8A according to an embodiment of the present disclosure.

FIG. 19 is a sectional view taken along a line corresponding to line I-I' of FIG. 8A according to an embodiment of the present disclosure. In describing FIG. 19, components identical to the components described with reference to FIG. 13 will be assigned with identical reference numerals, and descriptions thereabout will be omitted.

Referring to FIG. 19, the plurality of second pen sensing lines PSL2 and the peripheral pen sensing electrode P-SE3 may have a third width W3 in the direction DR2.

The plurality of second sensing lines RL may have a fourth width W4 in the second direction DR2. The fourth width W4 may be greater than the third width W3.

Figure 20:
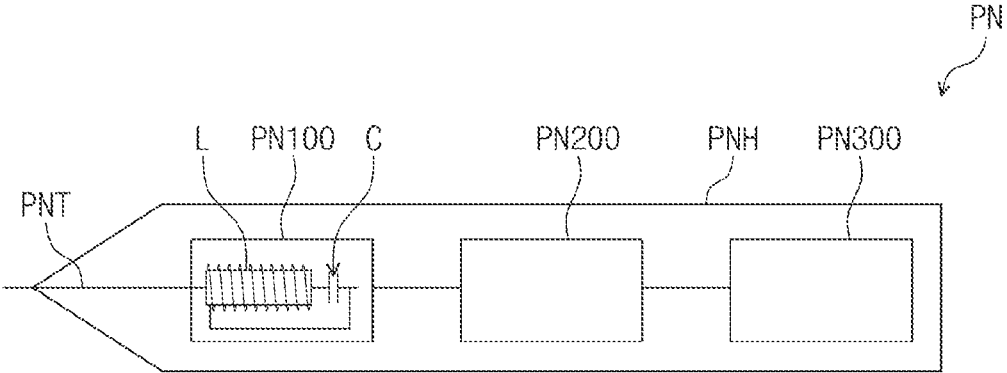
FIG. 20 is a block diagram illustrating an input device according to an embodiment of the present disclosure.

FIG. 20 is a block diagram illustrating the input device according to an embodiment of the present disclosure.

Referring to FIG. 20, the input device PN may include a housing PNH, a pen tip PNT, a resonance circuit unit PN100, a controller PN200, and a power supply unit PN300.

The housing PNH may have a pen shape. A receiving space may be formed in the housing PNH. The resonance circuit unit PN100, the controller PN200, and the power supply unit PN300 may be accommodated in the receiving space defined in the housing PNH.

The pen tip PNT may be disposed at an end portion of the housing PNH. For example, a portion of the pen tip PNT may be exposed outside the housing PNH, and the remaining portion of the pen tip PNT may be inserted into the housing PNH.

The resonance circuit unit PN100 may be a component that generates a signal. The resonance circuit unit PN100 may include an integrated circuit for a specific purpose or an oscillator. The resonance circuit unit PN100 may output an AC signal having a predetermined frequency.

The resonance circuit unit PN100 may include an inductor L and a capacitor C connected to the inductor L. An LC resonance circuit may be formed by the inductor L and the capacitor C. The capacitor C may be a variable capacitor whose capacitance is varied. The input device PN may be disposed on the display device DD, and the capacitor C may be charged during a charging section.

An induced current may be generated in the resonance circuit unit PN100 from the display device DD, and the resonance circuit unit PN100 may resonate by the induced current and may generate a magnetic field.

The power supply unit PN300 may supply power to the controller PN200. The power supply unit PN300 may include a battery or a high-capacity capacitor. However, this is illustrative, and the power supply unit PN300 according to an embodiment of the present disclosure may be omitted.

Figure 21A:
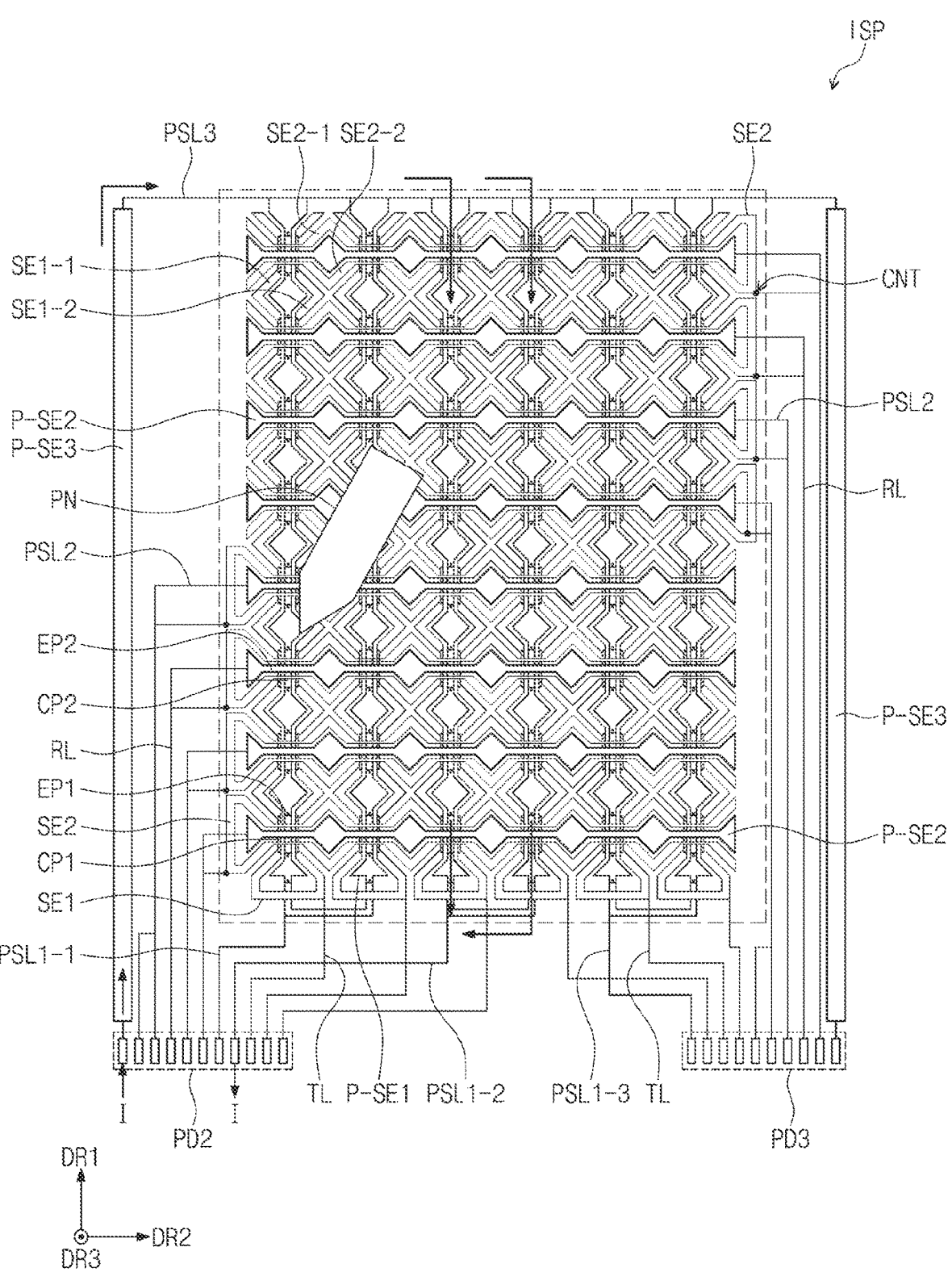
FIGS. 21A to 21C are views for explaining a charging operation of a pen disposed on the input sensor unit according to an embodiment of the present disclosure.
Figure 21B:
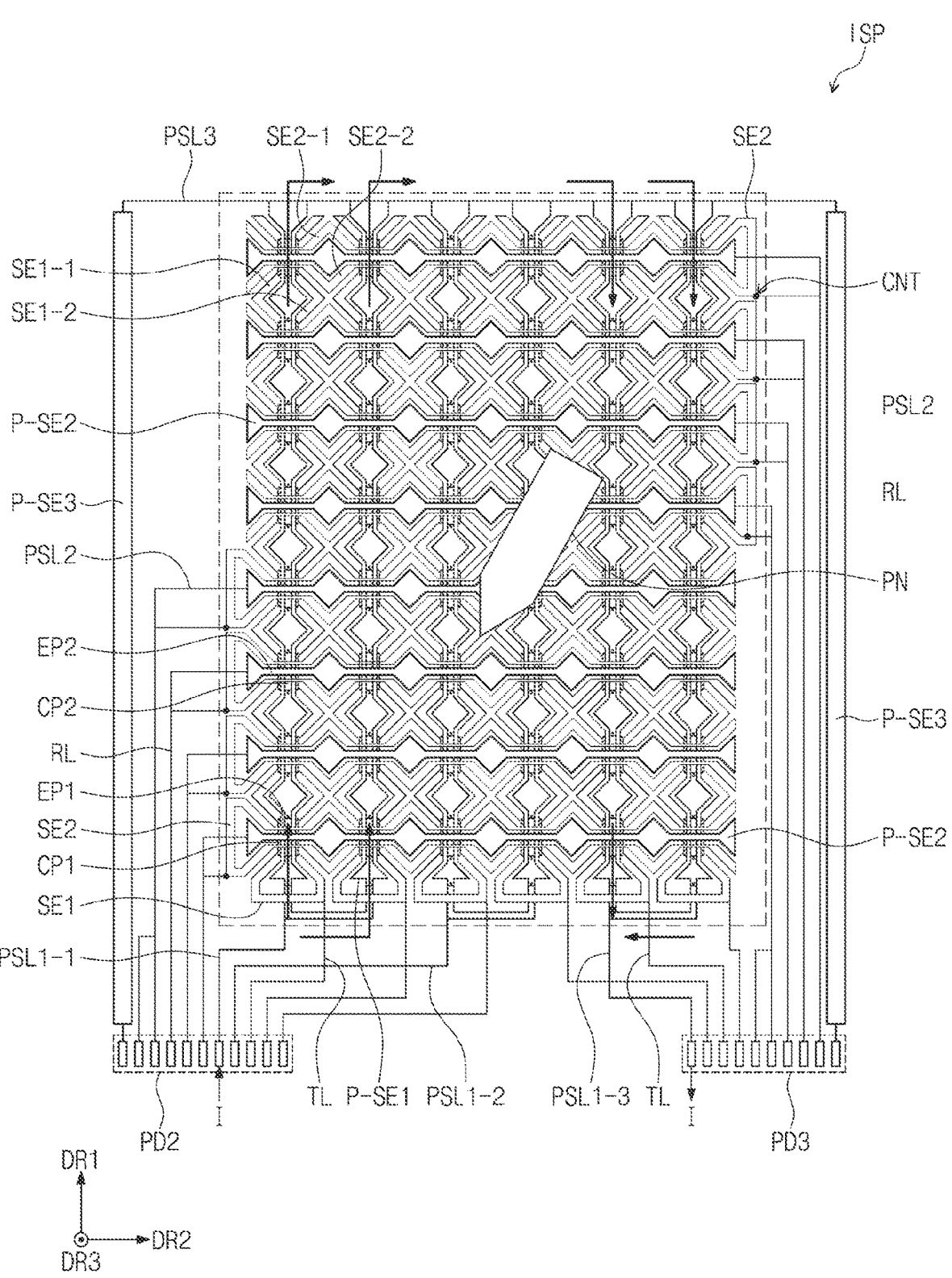
Figure 21C:
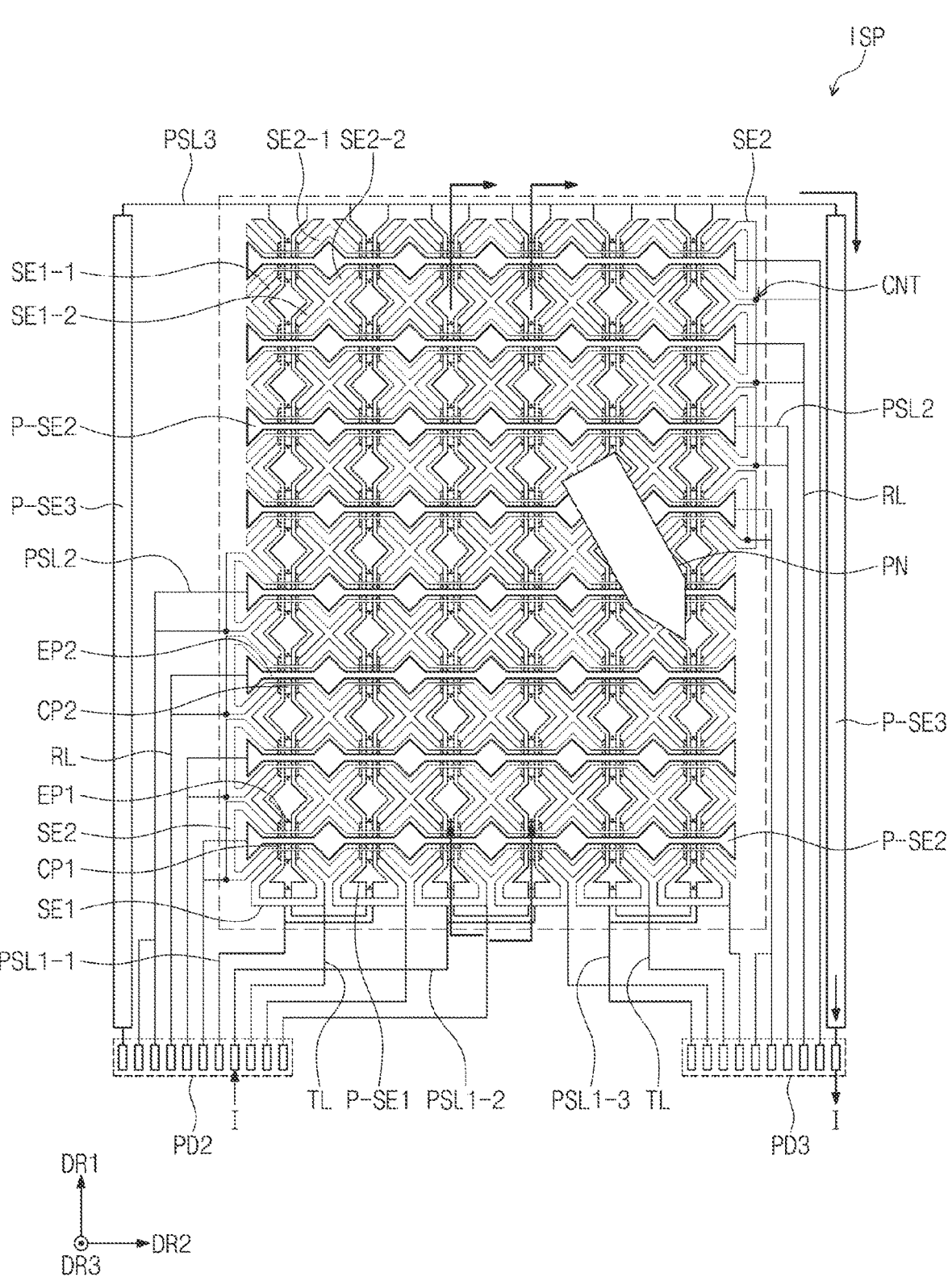

FIGS. 21A to 21C are views for explaining a charging operation of the pen disposed on the input sensor unit according to an embodiment of the present disclosure. In describing FIGS. 21A to 21C, the components described with reference to FIG. 8A will be assigned with identical reference numerals, and descriptions thereabout will be omitted.

Although a timing chart is not illustrated, the above-described second sensing section may include a charging section and a pen sensing section following the charging section. During the charging section, pen sensing lines 1-1 PSL1-1, 1-2 PSL1-2, and 1-3 PSL1-3, the first pen sensing electrodes P-SE1, and third pen sensing lines PSL3 may be sequentially driven to form a coil.

The borders of the active region AA and the peripheral region NAA of the input sensor unit ISP are omitted in FIGS. 21A to 21C. Hereinafter, in FIGS. 21A to 21C, the first pen sensing lines PSL1 are divided into the pen sensing line 1-1 PSL1-1, the pen sensing line 1-2 PSL1-2, and the pen sensing line 1-3 PSL1-3 in order from left to right.

Specifically, the second and third pads PD2 and PD3 may be connected to a drive circuit (not illustrated) of the sensing IC. The drive circuit may apply a drive signal to the peripheral pen sensing electrode P-SE3, the pen sensing lines 1-1 PSL1-1, 1-2 PSL1-2, and 1-3 PSL1-3, the first pen sensing electrodes P-SE1, and the third pen sensing lines PSL3 in a predetermined order. The drive signal may include a positive signal and a negative signal that will be described below.

Referring to FIGS. 20 and 21A, when viewed from above the plane, the input device PN may be disposed between the left peripheral pen sensing electrode P-SE3 and the first pen sensing electrodes P-SE1 connected to the pen sensing line 1-2 PSL1-2. That is, the input device PN may be disposed on the active region AA (refer to FIG. 8A) adjacent to the peripheral region NAA (refer to FIG. 8A).

In a first section of the charging section, the drive circuit may be connected to the second pad PD2 to which the left peripheral pen sensing electrode P-SE3 is connected and the second pad PD2 to which the pen sensing line 1-2 PSL1-2 is connected. The drive circuit may apply the drive current I to the left peripheral pen sensing electrode P-SE3. In this case, it may be defined that the positive signal is provided to the left peripheral pen sensing electrode P-SE3.

Although FIG. 21A illustrates an example that the positive signal is provided only to the left peripheral pen sensing electrode P-SE3, a drive method according to an embodiment of the present disclosure is not limited thereto. The positive signal may be provided to a plurality of electrodes adjacent to each other among the plurality of peripheral pen sensing electrodes P-SE3 and the plurality of first pen sensing electrodes P-SE1. For example, the positive signal may be provided to the left peripheral pen sensing electrode P-SE3 and the first pen sensing electrode P-SE1 adjacent to the left peripheral pen sensing electrode P-SE3.

The drive current I may flow through the left peripheral pen sensing electrode P-SE3, the third pen sensing line PSL3, the first pen sensing electrodes P-SE1 connected to the pen sensing line 1-2 PSL1-2, and the pen sensing line 1-2 PSL1-2. In this case, it may be defined that the negative signal is provided to the first pen sensing electrodes P-SE1 connected to the pen sensing line 1-2 PSL1-2.

At least one first pen sensing electrode P-SE1 may be disposed between the electrode to which the positive signal is provided and the electrode to which the negative signal is provided. In this case, magnetic flux may be generated by the drive current I that flows through the left peripheral pen sensing electrode P-SE3, the third pen sensing line PSL3, the first pen sensing electrodes P-SE1 connected to the pen sensing line 1-2 PSL1-2, and the pen sensing line 1-2 PSL1-2. The magnetic flux may be introduced into a ferrite core surrounding the coil of the inductor L of the input device PN, and at this time, an induced current may be generated in the coil of the inductor L. Charges may be charged in the capacitor C by the induced current.

During the charging section, a constant voltage may be applied to the second pen sensing electrodes P-SE2 through the second pen sensing lines PSL2.

In a case in which the peripheral pen sensing electrode P-SE3 does not exist unlike in the present disclosure, the third pen sensing line PSL3 may further extend in the first direction DR1 and may be connected to the second pad PD2. In this case, the resistance of the third pen sensing line PSL3 may be higher than those of the second pen sensing electrodes P-SE2, and therefore the drive current I may be lower than those of the second pen sensing electrodes P-SE2. In the third pen sensing line PSL3 extending in the first direction DR1, the magnetic flux generated when the drive current I is applied may be reduced due to an eddy current, and therefore the signal-to-noise ratio (SNR) may be decreased. Induced currents IC1 and IC2 (refer to FIG. 22) sensed when the input device PN is disposed on the active region AA adjacent to the peripheral region NAA (refer to FIG. 8A) may be decreased due to a small amount of charge in the input device PN. However, according to the present disclosure, the area of the left peripheral pen sensing electrode P-SE3 may be relatively wide. The wide area of the left peripheral pen sensing electrode P-SE3 may reduce the resistance of the left peripheral pen sensing electrode P-SE3, and the amount of drive current I provided to the left peripheral pen sensing electrode P-SE3 may be increased. Charging sensitivity may be improved when the input device PN is disposed on the active region AA (refer to FIG. 8A) adjacent to the peripheral region NAA (refer to FIG. 8A). Accordingly, the display device DD (refer to FIG. 1) may have improved sensing reliability.

Referring to FIGS. 20 and 21B, when viewed from above the plane, the input device PN may be disposed between the first pen sensing electrodes P-SE1 connected to the pen sensing line 1-1 PSL1-1 and the first pen sensing electrodes P-SE1 connected to the pen sensing line 1-3 PSL1-3.

In a second section following the first section of the charging section, the drive circuit may be connected to the second pad PD2 connected to the pen sensing line 1-1 PSL1-1 and the third pad PD3 connected to the pen sensing line 1-3 PSL1-3. The drive circuit may apply the drive current I to the pen sensing line 1-1 PSL1-1. In this case, it may be defined that the positive signal is provided to the first pen sensing electrodes P-SE1 to which the pen sensing line 1-1 PSL1-1 is connected.

The drive current I may flow through the pen sensing line 1-1 PSL1-1, the first pen sensing electrodes P-SE1 connected to the pen sensing line 1-1 PSL1-1, the third pen sensing line PSL3, the first pen sensing electrodes P-SE1 connected to the pen sensing line 1-3 PSL1-3, and the pen sensing line 1-3 PSL1-3. In this case, it may be defined that the negative signal is provided to the first pen sensing electrodes P-SE1 connected to the pen sensing line 1-3 PSL1-3.

In this case, magnetic flux may be generated by the drive current I that flows through the pen sensing line 1-1 PSL1-1, the first pen sensing electrodes P-SE1 connected to the pen sensing line 1-1 PSL1-1, the third pen sensing line PSL3, the first pen sensing electrodes P-SE1 connected to the pen sensing line 1-3 PSL1-3, and the pen sensing line 1-3 PSL1-3. The magnetic flux may be introduced into the ferrite core surrounding the coil of the inductor L of the input device PN, and at this time, an induced current may be generated in the coil of the inductor L. Charges may be charged in the capacitor C by the induced current.

Referring to FIGS. 20 and 21C, when viewed from above the plane, the input device PN may be disposed between the first pen sensing electrodes P-SE1 connected to the pen sensing line 1-2 PSL1-2 and the right peripheral pen sensing electrode P-SE3. That is, the input device PN may be disposed on the active region AA (refer to FIG. 8A) adjacent to the peripheral region NAA (refer to FIG. 8A).

In a third section following the second section of the charging section, the drive circuit may be connected to the second pad PD2 to which the pen sensing line 1-2 PSL1-2 is connected and the third pad PD3 to which the right peripheral pen sensing electrode P-SE3 is connected. The drive circuit may apply the drive current I to the pen sensing line 1-2 PSL1-2. In this case, it may be defined that the positive signal is provided to the first pen sensing electrodes P-SE1 to which the pen sensing line 1-2 PSL1-2 is connected.

The drive current I may flow through the pen sensing line 1-2 PSL1-2, the first pen sensing electrodes P-SE1 connected to the pen sensing line 1-2 PSL1-2, the third pen sensing line PSL3, and the right peripheral pen sensing electrode P-SE3. In this case, it may be defined that the negative signal is provided to the right peripheral pen sensing electrode P-SE3.

In this case, magnetic flux may be generated by the drive current I that flows through the pen sensing line 1-2 PSL1-2, the first pen sensing electrodes P-SE1 connected to the pen sensing line 1-2 PSL1-2, the third pen sensing line PSL3, and the right peripheral pen sensing electrode P-SE3. The magnetic flux may be introduced into the ferrite core surrounding the coil of the inductor L of the input device PN, and at this time, an induced current may be generated in the coil of the inductor L. Charges may be charged in the capacitor C by the induced current.

According to the present disclosure, the area of the right peripheral pen sensing electrode P-SE3 may be relatively wide. The wide area of the right peripheral pen sensing electrode P-SE3 may reduce the resistance of the right peripheral pen sensing electrode P-SE3, and the amount of drive current I provided to the right peripheral pen sensing electrode P-SE3 may be increased. Charging sensitivity may be improved when the input device PN is disposed on the active region AA (refer to FIG. 8A) adjacent to the peripheral region NAA (refer to FIG. 8A). Accordingly, the display device DD (refer to FIG. 1) may have improved sensing reliability.

Figure 22:
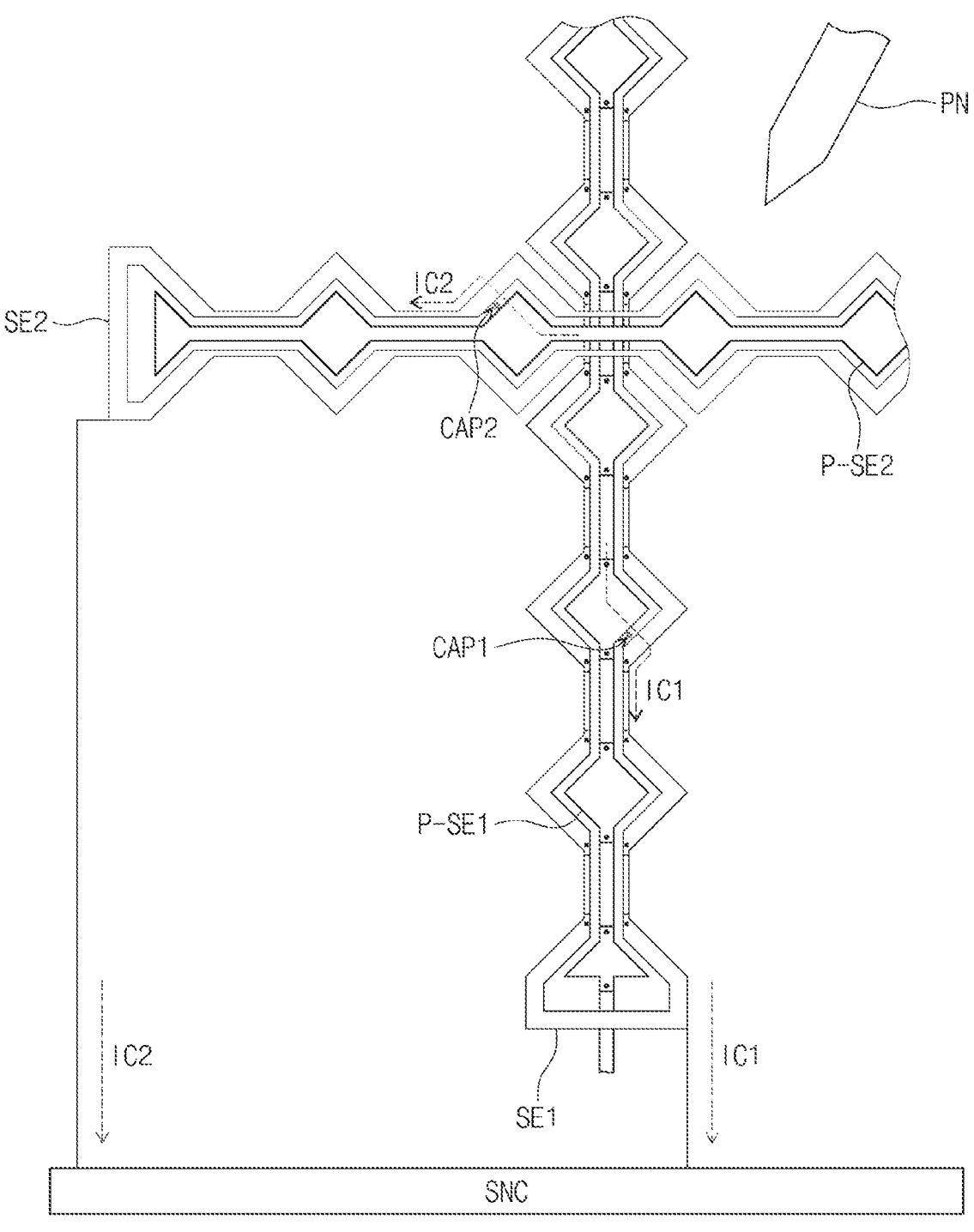
FIG. 22 is a view for explaining a sensing operation for a first input of the input device.

FIG. 22 is a view for explaining a sensing operation for the first input of the input device.

A pen sensing operation will be described with reference to FIG. 22. For convenience of description, one first pen sensing electrode P-SE1 and one second pen sensing electrode P-SE2 through which an induced current generated by the input device PN flows are illustrated as an example in FIG. 22. In addition, a first sensing electrode SE1 adjacent to the first pen sensing electrode P-SE1 and a second sensing electrode SE2 adjacent to the second pen sensing electrode P-SE2 are illustrated together with the first pen sensing electrode P-SE1 and the second pen sensing electrode P-SE2.

Referring to FIG. 22, during the pen sensing section following the charging section, a sensing circuit SNC of the sensing IC may be connected to the first and second sensing electrodes SE1 and SE2. During the pen sensing section, the drive current I may not be applied to the pen sensing lines 1-1 PSL1-1, 1-2 PSL1-2, and 1-3 PSL1-3, the first pen sensing electrodes P-SE1, and the third pen sensing lines PSL3.

The resonance circuit unit PN100 (refer to FIG. 20) of the input device PN may generate magnetic flux while consuming charged charges. Induced currents may be generated in the first pen sensing electrode P-SE1 and the second pen sensing electrode P-SE2 by the magnetic flux.

The first induced current IC1 generated in the first pen sensing electrode P-SE1 may be provided to the first sensing electrode SE1 by a first capacitor CAP1 formed by the first sensing electrode SE1 and the first pen sensing electrode P-SE1 and may be provided to the sensing circuit SNC. The second induced current IC2 generated in the second pen sensing electrode P-SE2 may be provided to the second sensing electrode SE2 by a second capacitor CAP2 formed by the second sensing electrode SE2 and the second pen sensing electrode P-SE2 and may be provided to the sensing circuit SNC.

The sensing circuit SNC may sense the first induced current IC1 and the second induced current IC2 received through the first and second sensing electrodes SE1 and SE2 and may sense the position of the input device PN. That is, the first input of the input device PN may be sensed by the first and second pen sensing electrodes P-SE1 and P-SE2 and the first and second sensing electrodes SE1 and SE2.

According to the present disclosure, the area of the peripheral pen sensing electrode P-SE3 (refer to FIG. 8A) may be relatively wide. The wide area of the peripheral pen sensing electrode P-SE3 may reduce the resistance of the peripheral pen sensing electrode P-SE3 (refer to FIG. 8A), and the amount of drive current I (refer to FIG. 21A) provided to the peripheral pen sensing electrode P-SE3 (refer to FIG. 8A) may be increased. The amount of charge may increase when the input device PN is disposed on the active region AA (refer to FIG. 8A) adjacent to the peripheral region NAA (refer to FIG. 8A). Accordingly, the induced currents IC1 and IC2 sensed when the input device PN is disposed on the active region AA (refer to FIG. 8A) adjacent to the peripheral region NAA (refer to FIG. 8A) may be increased. The input sensor unit ISP (refer to FIG. 8A) may easily sense the first input of the input device PN. Thus, the display device DD (refer to FIG. 1) having improved sensing reliability may be provided.

As described above, the peripheral pen sensing electrode may have a relatively large area. The large area of the peripheral pen sensing electrode may reduce the resistance of the peripheral pen sensing electrode, and the amount of drive current provided to the peripheral pen sensing electrode may be increased. The amount of charge may be improved when the input device is disposed on the active region adjacent to the peripheral region. Accordingly, the induced currents sensed by the input sensor unit may be increased when the input device is disposed on the active region adjacent to the peripheral region. The input sensor unit may easily sense the first input of the input device. Thus, the display device may have improved sensing quality.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device comprising:
a display panel; and
an input sensor unit disposed on the display panel, the input sensor unit having an active region and a peripheral region, the peripheral region being adjacent to the active region,
wherein the input sensor unit includes:
a base layer;
a plurality of sensing electrodes disposed in the active region and disposed on the base layer;
a plurality of conductive lines disposed in the peripheral region and disposed on the base layer, the plurality of conductive lines being electrically connected to the plurality of sensing electrodes; and
a peripheral pen sensing electrode disposed in the peripheral region and spaced apart from the plurality of sensing electrodes,
wherein the plurality of conductive lines are disposed between the peripheral pen sensing electrode and the active region in which the plurality of sensing electrodes are disposed, and
wherein the peripheral pen sensing electrode extends lengthwise in a first direction, and
wherein the plurality of sensing electrodes include:
a first sensing electrode;
a second sensing electrode insulated from the first sensing electrode and extending across the first sensing electrode;
a pair of first pen sensing electrodes extending in the first direction and including a first pen sensing electrode insulated from the second sensing electrode and extending across the second sensing electrode, the first pen sensing electrode being adjacent to the first sensing electrode; and
a second pen sensing electrode insulated from the first sensing electrode and the first pen sensing electrode and extending across the first sensing electrode and the first pen sensing electrode in a second direction different from the first direction, the second pen sensing electrode being adjacent to the second sensing electrode,
wherein a first width of the peripheral pen sensing electrode along a majority of a length thereof in the first direction is greater in the second direction than a second width of each of the plurality of conductive lines in the second direction.

2. The display device of claim 1,
wherein the plurality of conductive lines include:
a sensing line electrically connected to the second sensing electrode; and
a pen sensing line electrically connected to the second pen sensing electrode.

3. The display device of claim 2,
wherein the pen sensing line and the peripheral pen sensing electrode are disposed in the same layer.

4. The display device of claim 2,
wherein the pen sensing line and the peripheral pen sensing electrode are disposed in a layer different from a layer in which the sensing line is disposed.

5. The display device of claim 4,
wherein the input sensor unit further includes an insulating layer, wherein the pen sensing line and the peripheral pen sensing electrode are disposed on the base layer, wherein the insulating layer covers the pen sensing line and the peripheral pen sensing electrode, and wherein the sensing line is disposed on the insulating layer.

6. The display device of claim 2, wherein the input sensor unit further includes an insulating layer, wherein a first pen sensing line part of the pen sensing line and a first sensing part of the peripheral pen sensing electrode are disposed on the base layer, wherein the insulating layer covers the first pen sensing line part and the first sensing part, wherein the sensing line, a second pen sensing line part of the pen sensing line, and a second sensing part of the peripheral pen sensing electrode are disposed on the insulating layer, wherein the insulating layer has a first contact hole and a second contact hole defined therein, wherein the first pen sensing line part and the second pen sensing line part are electrically connected with each other through the first contact hole, and wherein the first sensing part and the second sensing part are electrically connected with each other through the second contact hole.

7. The display device of claim 6, wherein the first sensing part has a greater width than the second sensing part in the second direction.

8. The display device of claim 7, wherein the first sensing part overlaps the second sensing part and the sensing line when viewed in a plan view.

9. The display device of claim 2, wherein the input sensor unit further includes an insulating layer, wherein the pen sensing line, the peripheral pen sensing electrode, and a first line part of the sensing line are disposed on the base layer, wherein the insulating layer covers the pen sensing line, the peripheral pen sensing electrode, and the first line part, wherein a second line part of the sensing line is disposed on the insulating layer, wherein the insulating layer has a contact hole defined therein, and wherein the first line part and the second line part are electrically connected with each other through the contact hole.

10. The display device of claim 2, wherein the sensing line overlaps the pen sensing line when viewed in a plan view.

11. The display device of claim 2, wherein the sensing line overlaps the peripheral pen sensing electrode when viewed in a plan view.

12. The display device of claim 1, wherein the peripheral pen sensing electrode is electrically connected to the pair of first pen sensing electrodes.

13. The display device of claim 1, wherein the peripheral pen sensing electrode has a larger area than the plurality of conductive lines when viewed in a plan view.

14. An input sensor unit comprising:

a base layer having an active region and a peripheral region, the peripheral region being adjacent to the active region;

an insulating layer disposed on the base layer, a plurality of sensing electrodes disposed in the active region and disposed on the base layer;

a plurality of conductive lines disposed in the peripheral region and disposed on the base layer, the plurality of conductive lines being electrically connected to the plurality of sensing electrodes; and a peripheral pen sensing electrode disposed in the peripheral region and spaced apart from the plurality of sensing electrodes, wherein the plurality of conductive lines are disposed between the peripheral pen sensing electrode and the active region in which the plurality of sensing electrodes are disposed, and wherein the peripheral pen sensing electrode extends lengthwise in a first direction, and wherein the plurality of sensing electrodes include:

a first sensing electrode;

a second sensing electrode insulated from the first sensing electrode and extending across the first sensing electrode;

a pair of first pen sensing electrodes extending in the first direction and including a first pen sensing electrode insulated from the second sensing electrode and extending across the second sensing electrode, the first pen sensing electrode being adjacent to the first sensing electrode; and a second pen sensing electrode insulated from the first sensing electrode and the first pen sensing electrode and extending across the first sensing electrode and the first pen sensing electrode in a second direction different from the first direction, the second pen sensing electrode being adjacent to the second sensing electrode, wherein the plurality of conductive lines include:

a sensing line electrically connected to the second sensing electrode; and a pen sensing line electrically connected to the second pen sensing electrode, and wherein a first width of the peripheral pen sensing electrode along a majority of a length thereof in the first direction is greater in the second direction than a second width of the sensing line in the second direction.

15. The input sensor unit of claim 14, wherein the pen sensing line and the peripheral pen sensing electrode are disposed in the same layer.

16. The input sensor unit of claim 14, wherein the pen sensing line and the peripheral pen sensing electrode are disposed in a layer different from a layer in which the sensing line is disposed.

17. The input sensor unit of claim 14, wherein the pen sensing line and the peripheral pen sensing electrode are disposed on the base layer, wherein the insulating layer covers the pen sensing line and the peripheral pen sensing electrode, and wherein the sensing line is disposed on the insulating layer.

18. The input sensor unit of claim 14, wherein a first pen sensing line part of the pen sensing line and a first sensing part of the peripheral pen sensing electrode are disposed on the base layer, wherein the insulating layer covers the first pen sensing line part and the first sensing part, wherein the sensing line, a second pen sensing line part of the pen sensing line, and a second sensing part of the peripheral pen sensing electrode are disposed on the insulating layer, wherein the insulating layer has a first contact hole and a second contact hole defined therein, wherein the first pen sensing line part and the second pen sensing line part are electrically connected with each other through the first contact hole, and wherein the first sensing part and the second sensing part are electrically connected with each other through the second contact hole.

19. The input sensor unit of claim 18, wherein the first sensing part has a greater width than the second sensing part in the second direction.

20. The input sensor unit of claim 14, wherein the pen sensing line, the peripheral pen sensing electrode, and a first line part of the sensing line are disposed on the base layer, wherein the insulating layer covers the pen sensing line, the peripheral pen sensing electrode, and the first line part, wherein a second line part of the sensing line is disposed on the insulating layer, wherein the insulating layer has a contact hole defined therein, and wherein the first line part and the second line part are electrically connected through the contact hole.

21. A display device comprising:

a display panel; and an input sensor unit disposed on the display panel, the input sensor unit having an active region and a peripheral region, the peripheral region being adjacent to the active region, wherein the input sensor unit includes:

a base layer, a plurality of sensing electrodes disposed in the active region and disposed on the base layer;

a plurality of conductive lines disposed in the peripheral region and disposed on the base layer, the plurality of conductive lines being electrically connected to the plurality of sensing electrodes;

a plurality of peripheral pen sensing electrodes disposed in the peripheral region, wherein each of the plurality of peripheral pen sensing electrodes has the same length in a first direction and extend lengthwise in the first direction, and wherein the plurality of conductive lines are disposed between the plurality of peripheral pen sensing electrodes, and wherein a first width of a peripheral pen sensing electrode among the plurality of peripheral pen sensing electrodes in a second direction different from the first direction is greater than a second width of each of the plurality of conductive lines in the second direction.

* * * * *